(12) United States Patent
Ishikawa et al.

(10) Patent No.: US 7,262,101 B2
(45) Date of Patent: Aug. 28, 2007

(54) METHOD OF MANUFACTURING A SEMICONDUCTOR INTEGRATED CIRCUIT DEVICE

(75) Inventors: Dai Ishikawa, Ome (JP); Satoshi Sakai, Yokohama (JP); Atsushi Hiraiwa, Higashimurayama (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/917,294

(22) Filed: Aug. 13, 2004

(65) Prior Publication Data

US 2005/0020018 A1 Jan. 27, 2005

Related U.S. Application Data

(63) Continuation of application No. 10/465,642, filed on Jun. 20, 2003, now Pat. No. 6,794,257.

(30) Foreign Application Priority Data

Jun. 20, 2002 (JP) .............................. 2002-179321

(51) Int. Cl.
*H01L 21/8234* (2006.01)
*H01L 21/336* (2006.01)
(52) U.S. Cl. ................ 438/275; 438/287; 257/E51.007
(58) Field of Classification Search ........ 438/287–308, 438/275–278; 257/E51.007
See application file for complete search history.

(56) References Cited

U.S. PATENT DOCUMENTS 5,591,681 A 1/1997 Wristers et al.
6,265,327 B1 * 7/2001 Kobayashi et al. ......... 438/776
6,649,538 B1 11/2003 Cheng et al.
6,794,257 B2 * 9/2004 Ishikawa et al. ............ 438/287
2002/0072177 A1 6/2002 Grider
2002/0111000 A1 8/2002 Kawakami et al.
2003/0015763 A1 * 1/2003 Yoneda ..................... 257/411
2003/0141560 A1 * 7/2003 Sun ........................... 257/410
2003/0211672 A1 * 11/2003 Yao ........................... 438/197

FOREIGN PATENT DOCUMENTS

| JP | 8-167664 | 6/1996 |
| JP | 2000-357688 | 12/2000 |
| JP | 2001-332724 | 11/2001 |

\* cited by examiner

*Primary Examiner*—H. Jey Tsai
(74) *Attorney, Agent, or Firm*—Antonelli, Terry, Stout & Kraus, LLP.

(57) ABSTRACT

A method of manufacturing a semiconductor integrated circuit device comprising forming a silicon oxide film as thin as 5 nm or less on the surfaces of p type wells and n type wells by wet oxidizing a substrate, heating the substrate in an atmosphere containing about 5% of an NO gas to introduce nitrogen into the silicon oxide film so as to form a silicon oxynitride film, exposing the substrate to a nitrogen plasma atmosphere to further introduce nitrogen into the silicon oxynitride film in order to form a silicon oxynitride gate insulating film having a first peak concentration near the interface with the substrate and a second peak concentration near the surface thereof. Thereby, the concentration of nitrogen in the gate insulating film is increased without raising the concentration of nitrogen near the interface between the substrate and the gate insulating film to a higher level than required.

19 Claims, 25 Drawing Sheets

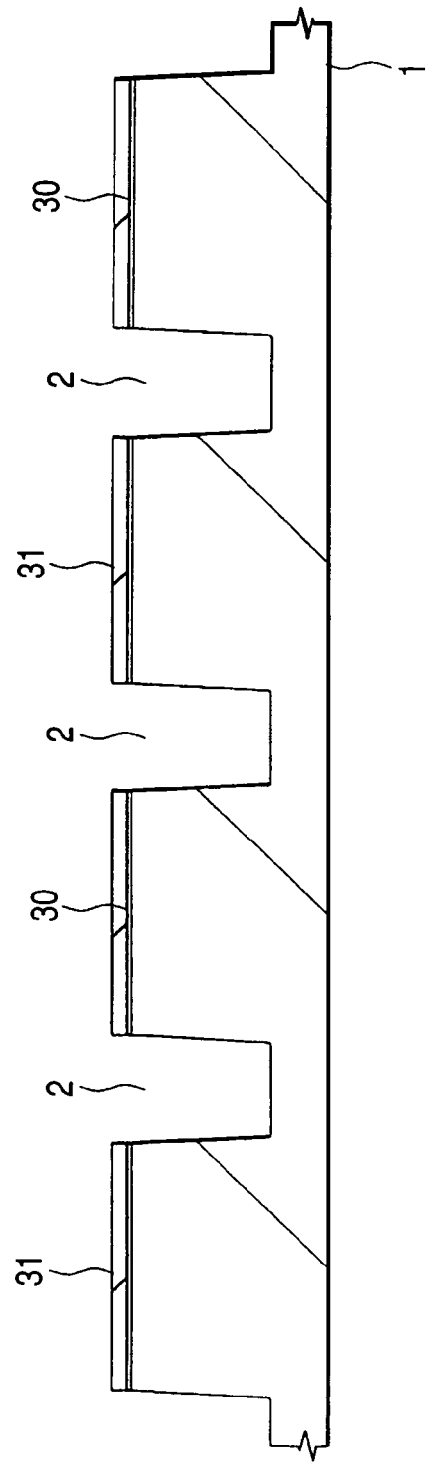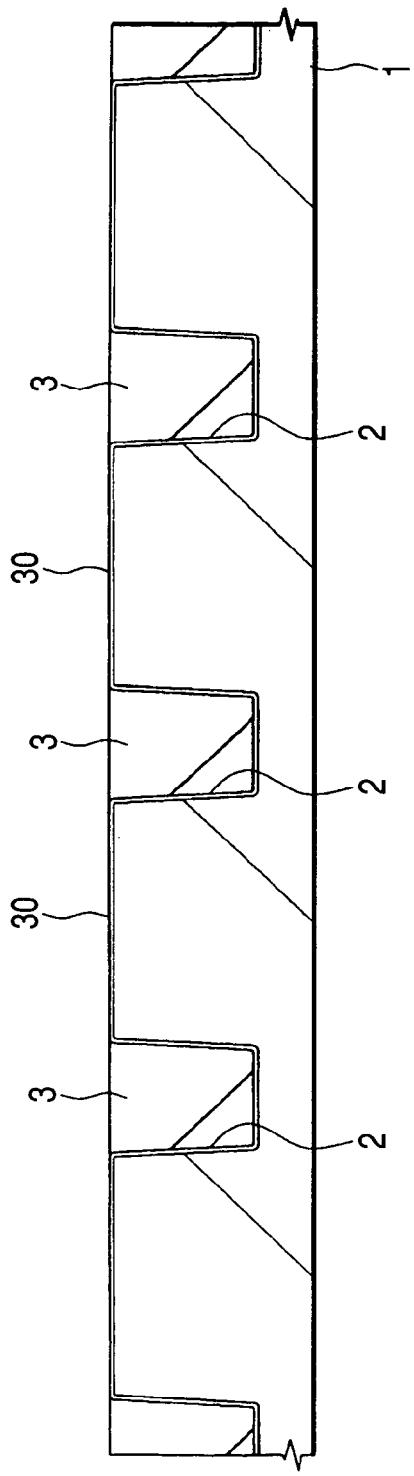

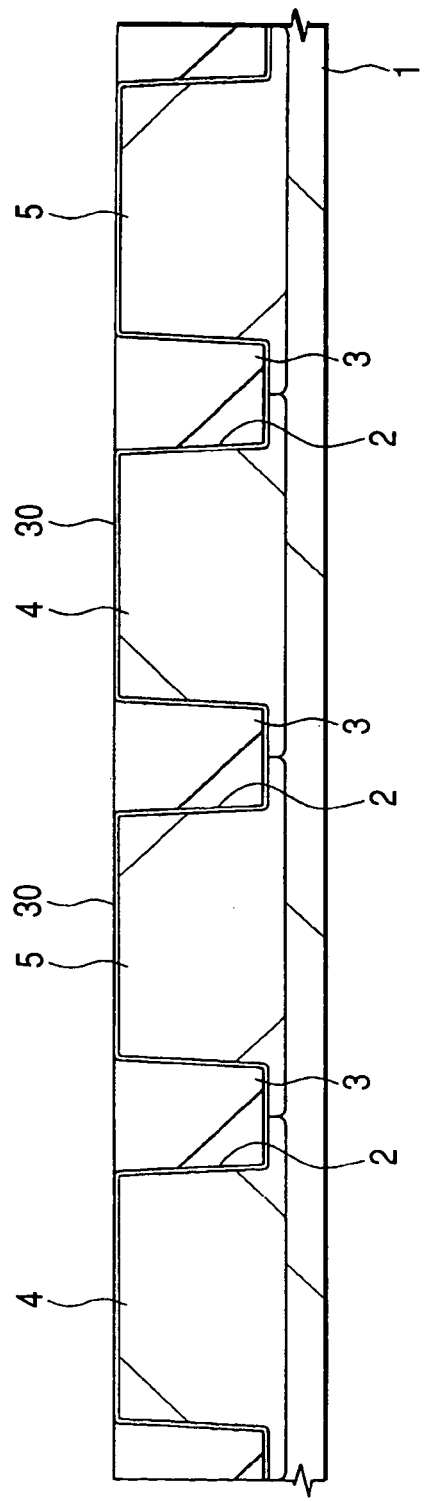
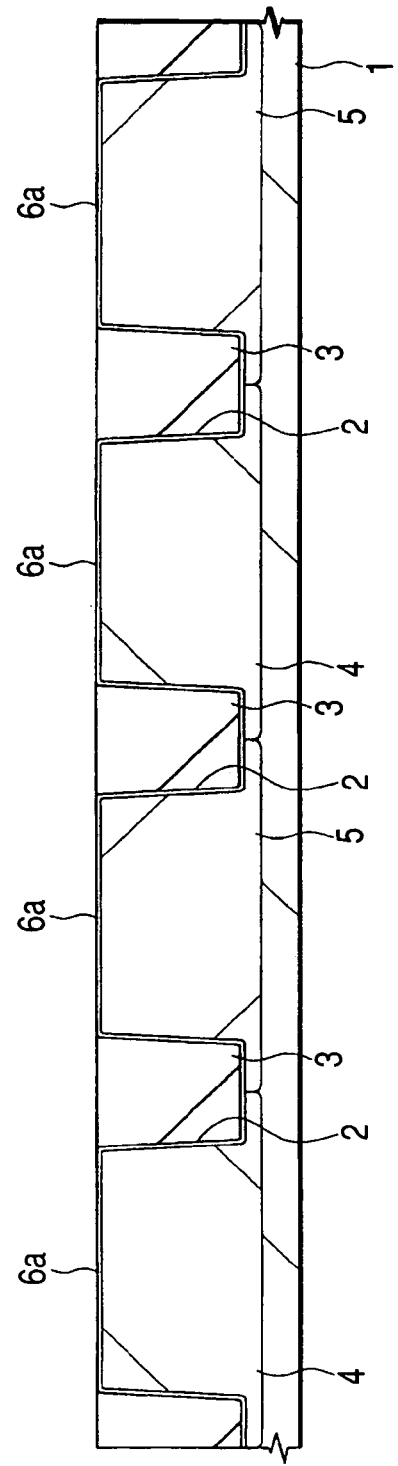

ND OF MANUFACTURING A SEMICONDUCTOR INTEGRATED CIRCUIT DEVICE

METHOD OF MANUFACTURING A SEMICONDUCTOR INTEGRATED CIRCUIT DEVICE

This application is a Continuation application of application Ser. No. 10/465,642, filed Jun. 20, 2003, now U. S. Pat. No. 6,794,257 the contents of which are incorporated herein by reference in their entirety.

BACKGROUND OF THE INVENTION

The present invention relates to a semiconductor integrated circuit device and to a manufacture technology for the same and, specifically, to a technology which is effectively applied to a semiconductor integrated circuit device comprising a silicon oxynitride film as a gate insulating film for MISFET (Metal Insulator Semiconductor Field Effect Transistor).

To realize the low-voltage operation of MISFET, a gate oxide film must be made thinner in proportion to a reduction in the thickness of MISFET. However, when the thickness of the gate oxide film is reduced, a direct tunnel current running through the film grows, thereby causing a gate leak current which cannot be ignored from the viewpoint of reducing power consumption.

To cope with this, attempts have been made to increase the physical thickness of the gate insulating film by using a high dielectric film such as a titanium oxide ($TiO_2$) or tantalum oxide ($Ta_2O_5$) film having a higher relative dielectric constant than silicon oxide. However, as the gate insulating film formed of this high dielectric film has many problems with interfacial control and the like, use of this film in mass-produced devices is currently considered to be difficult.

Since a silicon oxynitride film formed by nitriding part of a silicon oxide film has a higher dielectric constant than silicon oxide, the effect of reducing a leak current by increasing the physical thickness of a gate insulating film can be expected from this film. It is reported that a gate insulating film formed of a silicon oxynitride film is effective in the suppression of boron leakage that an impurity (boron) contained in a p type gate electrode goes through the channel area of a substrate by a heat treatment during the process, the improvement of hot carrier resistance of MISFET and the improvement of the electron mobility of an n channel type MISFET.

As means of nitriding a gate insulating film made from silicon oxide, there is known a method in which a substrate is heated in a high-temperature atmosphere of around 1,000° C. containing an NO (nitrogen monoxide) gas after a silicon oxide film is formed on the silicon substrate.

Japanese Unexamined Patent Publication No. 2001-332724 discloses a technology for forming a gate insulating film from silicon oxynitride having two peaks of nitrogen concentration at the interface with a silicon substrate and in the film, to prevent the penetration of boron contained in the p type gate electrode and to improve hot carrier resistance, in an MIS device having a so-called dual gate structure using an n type gate electrode as an n channel MISFET and a p type gate electrode as a p channel MISFET.

To form the above silicon oxynitride film, the silicon substrate is first wet oxidized to form a silicon oxide film having a thickness of about 7 nm on the surface, heated in an atmosphere containing an NO gas to segregate nitrogen at the interface between the silicon oxide film and the substrate, and dry oxidized. When this dry oxidation is carried out, the interface between the silicon oxide film and the substrate is oxidized to form a silicon oxide film having a thickness of 1 to 2 nm underlying an area where nitrogen has been segregated. Thereafter, when the substrate is heated in an atmosphere containing an NO gas again, nitrogen is segregated at the interface between the silicon oxide film underlying the area where nitrogen has been segregated and the substrate, thereby obtaining a gate insulating film made of silicon oxynitride and having two peaks of nitrogen concentration at the interface with the silicon substrate and in the film.

Japanese Unexamined Patent Publication No. 2000-357688 discloses a technology for forming a gate insulating film from silicon oxynitride having two peaks in nitrogen concentration distribution in the thickness direction by a method different from that of the above publication.

In this publication, the silicon substrate is first heated in an oxygen atmosphere to form a silicon oxide film having a thickness of about 5 nm on the surface and heated in an NO gas atmosphere to form a silicon oxynitride film having a thickness of about 5.5 nm having a peak of nitrogen concentration near the interface with the substrate. Thereafter, the surface of this silicon oxynitride film is etched with a hydrofluoric acid aqueous solution to remove its surface layer portion, thereby obtaining a silicon oxynitride film having a thickness of about 1 nm and containing nitrogen in the entire thickness direction in large quantities. Thereafter, a second heat treatment is carried out in an NO gas or $N_2O$ gas atmosphere to grow a new thermally oxidized film on the substrate and introduce nitrogen into the thermally oxidized film, thereby obtaining a silicon oxynitride film having two peaks in nitrogen concentration distribution in the thickness direction.

Japanese Unexamined Patent Publication No. Hei 8(1996)-167664 (U.S. Pat. No. 5,591,681) discloses a technology for forming a silicon oxide film containing nitrogen by heating in a NO or $N_2O$ gas atmosphere.

SUMMARY OF THE INVENTION

When the above silicon oxynitride film is used as a gate insulating film for MISFET and the gate insulating film becomes thinner in proportion to a reduction in the thickness of MISFET, the dielectric constant must be increased by raising the concentration of nitrogen contained in the film in order to reduce a gate leak current.

However, it is difficult to increase the dielectric constant of the silicon oxynitride film, formed by the conventional oxynitridation treatment in which nitrogen is introduced into a silicon nitride film by heating a substrate in a NO gas or $N_2O$ gas atmosphere, by increasing the concentration of nitrogen contained in the entire film because the surface of the film is not nitrided although the concentration of nitrogen near the interface between the film and the substrate can be increased.

When a portion near the interface between the gate insulating film and the substrate is nitrided excessively, a trap in the interfacial level or the film increases, thereby causing a problem such as a reduction in the carrier mobility of MISFET.

FIG. 30 is a graph showing the relationship between the concentration of nitrogen at the interface between the gate insulating film and the substrate and the carrier mobility of MISFET. As shown in the graph, in the case of an n channel MISFET in which electrons are carriers, when several atomic percents of nitrogen is introduced into the interface, the carrier mobility becomes higher than when nitrogen is not introduced but when the concentration of nitrogen further increases, the above effect gradually decreases.

Meanwhile, in the case of a p channel MISFET in which electron holes are carriers, the carrier mobility becomes lower in proportion to the concentration of nitrogen at the interface. When the concentration of nitrogen is higher than 10 atomic %, the carrier mobility drops by about 20%, thereby reducing the drain current (Ids) by about 10% and making difficult circuit design practically.

Thus, the method of introducing nitrogen into a silicon oxide film by the oxynitridation treatment has limits in the amount of introduced nitrogen.

In the above-described technology for forming a silicon oxynitride film having two peaks in nitrogen concentration distribution in the thickness direction, the high-temperature oxynitridation treatment is carried out several times with the result that the silicon oxynitride film becomes thick, thereby making it difficult to form a gate insulating film as thin as 5 nm or less.

It is an object of the present invention to provide a technology capable of forming a silicon oxynitride film having a high concentration of nitrogen in a semiconductor integrated circuit device comprising the silicon oxynitride film as a gate insulating film for MISFET.

It is another object of the present invention to provide a technology capable of improving the reliability of a semiconductor integrated circuit device comprising a silicon oxynitride film as a gate insulating film for MISFET.

The above and other objects and new features of the present invention will become apparent from the following description and the accompanying drawings.

The present invention relates to the following.

The method of manufacturing a semiconductor integrated circuit device according to the present invention comprises the following steps:

(a) forming a silicon oxide gate insulating film on a main surface of a semiconductor substrate by heating the semiconductor substrate made from monocrystal silicon;
(b) introducing nitrogen into the gate insulating film by heating the semiconductor substrate in an atmosphere containing an NO gas or $N_2O$ gas;
(c) introducing nitrogen into the gate insulating film by exposing the semiconductor substrate to a nitrogen plasma atmosphere; and
(d) forming gate electrodes for MISFET over the gate insulating film after the steps (b) and (c).

According to the above means, since a gate insulating film can be formed from silicon oxynitride by using both an oxynitridation treatment and a nitrogen plasma treatment, the concentration of nitrogen contained in the gate insulating film can be increased without raising the concentration of nitrogen near the interface between the substrate and the gate insulating film to a higher level than required.

According to a first aspect of the present invention, there is provided a semiconductor integrated circuit device comprising MISFET's having a 5 nm or less-thick gate insulating film formed from silicon oxynitride on the main surface of a semiconductor substrate made from monocrystal silicon, wherein nitrogen contained in the gate insulating film has a first peak concentration near the interface between the semiconductor substrate and the gate insulating film and a second peak concentration near the surface of the gate insulating film.

According to a second aspect of the present invention, there is provided a semiconductor integrated circuit device wherein the second peak concentration is higher than the first peak concentration.

According to a third aspect of the present invention, there is provided a semiconductor integrated circuit device wherein the MISFET's have a gate electrode containing a silicon film doped with boron.

According to a fourth aspect of the present invention, there is provided a semiconductor integrated circuit device wherein the first peak concentration is in the range of 1 to 10 atomic %.

According to a fifth aspect of the present invention, there is provided a semiconductor integrated circuit device comprising MISFET's having a 5 nm or less-thick gate insulating film formed of a laminate consisting of a silicon oxynitride film and a silicon nitride film formed over the silicon oxynitride film on the main surface of a semiconductor substrate made from monocrystal silicon, wherein the concentration of nitrogen contained in the silicon oxynitride film is the highest near the interface between the semiconductor substrate and the silicon oxynitride film.

According to a sixth aspect of the present invention, there is provided a semiconductor integrated circuit device wherein the MISFET's have a gate electrode containing a silicon film doped with boron.

According to a seventh aspect of the present invention, there is provided a semiconductor integrated circuit device wherein the concentration of nitrogen contained near the interface between the semiconductor substrate and the silicon oxynitride film is in the range of 1 to 10 atomic %.

BRIEF DESCRIPTION OF THE DRAWINGS

FIG. 1 a sectional view of a principal portion of a semiconductor substrate showing a method of manufacturing a semiconductor integrated circuit device according to an embodiment of the present invention;

FIG. 2 is a sectional view of the principal portion of a semiconductor substrate showing the method of manufacturing a semiconductor integrated circuit device according to the above embodiment of the present invention;

FIG. 3 is a sectional view of the principal portion of a semiconductor substrate showing the method of manufacturing a semiconductor integrated circuit device according to the above embodiment of the present invention;

FIG. 4 is a sectional view of the principal portion of a semiconductor substrate showing the method of manufacturing a semiconductor integrated circuit device according to the above embodiment of the present invention;

DETAILED DESCRIPTION OF THE PREFERRED EMBODIMENTS

Figure 5:
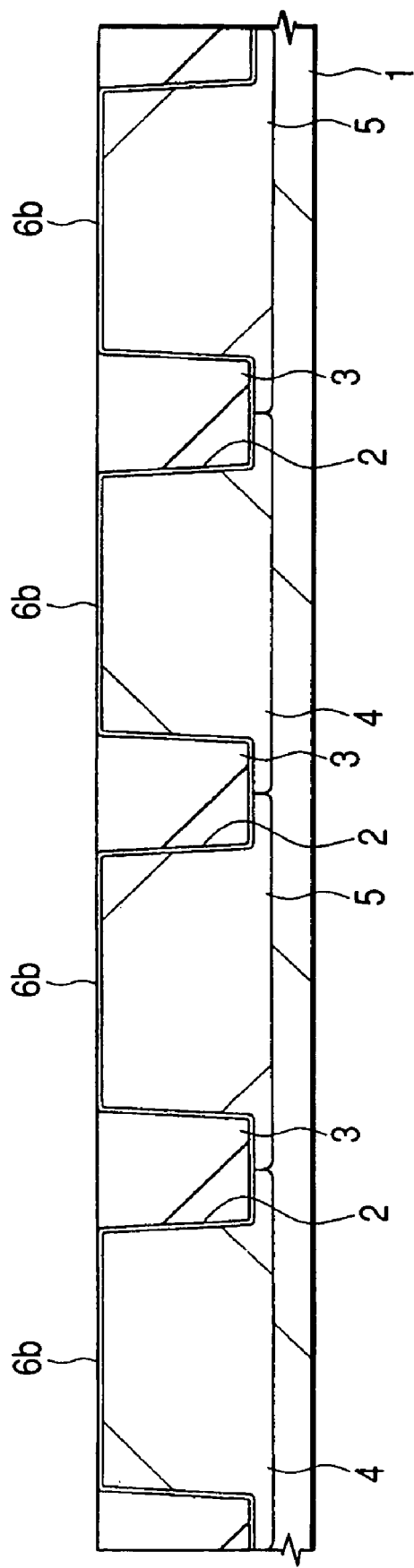
FIG. 5 is a sectional view of the principal portion of a semiconductor substrate showing the method of manufacturing a semiconductor integrated circuit device according to the above embodiment of the present invention.

Preferred embodiments of the present invention will be described in detail with reference to the accompanying drawings. Members having the same symbol have the same function in all the diagrams for explaining the embodiments and a repeated description of the members is omitted. In the following embodiments, the same or similar description is not repeated unless it is necessary.

Embodiment 1

The method of manufacturing a CMOS-LSI according to this embodiment will be described in the order of steps with reference to FIGS. 1 to 15.

First, as shown in FIG. 1, element separation grooves 2 are formed in the main surface of a semiconductor substrate (to be referred to as "substrate" hereinafter) made from p type monocrystal silicon having a resistivity of about 1 to 10 Ωcm. To form the element separation grooves 2, the substrate 1 is thermally oxidized to form a silicon oxide film 30 having a thickness of about 10 nm on the surface, a silicon nitride film 31 having a thickness of about 100 nm deposited on the top of the silicon oxide film 30 by CVD is patterned, and then the substrate 1 is etched by using this silicon nitride film 31 as a mask.

Thereafter, as shown in FIG. 2, a silicon oxide film 3 having a thickness of about 500 nm is deposited on the substrate 1 by CVD, the silicon oxide film 3 around the element separation grooves 2 is removed by a chemical and mechanical polishing method, and then the silicon nitride film 31 on the substrate 1 is removed by wet etching using hot phosphoric acid. Thereafter, the silicon oxide film 3 in the element separation grooves 2 is made fine by heating the substrate 1.

Subsequently, as shown in FIG. 3, p type wells 4 are formed on part of the main surface of the substrate 1 and n type wells 5 are formed on the other part of the main surface. To form the p type wells 4 and the n type wells 5, after boron ions are injected into part of the substrate 1 and phosphorus ions are injected into the other part of the substrate 1, the substrate 1 is heated to diffuse these impurities (boron and phosphorus) into the substrate 1.

After the silicon oxide film 30 on the surface of the substrate 1 is removed by wet etching with hydrofluoric acid, as shown in FIG. 4, the substrate 1 is wet oxidized to form a silicon oxide film 6a having a thickness of 5 nm or less (3.0 nm in this embodiment) on the surfaces of the p type wells 4 and the n type wells 5. The silicon oxide film 6a may be formed by an oxidation method other than the above wet oxidation method, for example, dry oxidation method or the exposure of the substrate 1 to an atmosphere containing active oxygen.

Thereafter, the substrate 1 is heated in an atmosphere containing 5% of an NO (nitrogen monoxide) gas at 900 to 1,100° C. When this heat treatment is carried out, nitrogen is introduced into the silicon oxide film 6a formed on the surface of the substrate 1 to change the silicon oxide film 6a into a silicon oxynitride film 6b (FIG. 5). The silicon oxynitride film 6b may be formed by heating the substrate 1 in an atmosphere containing an $N_2O$ (nitrous oxide) gas in place of the NO gas.

Figure 6:
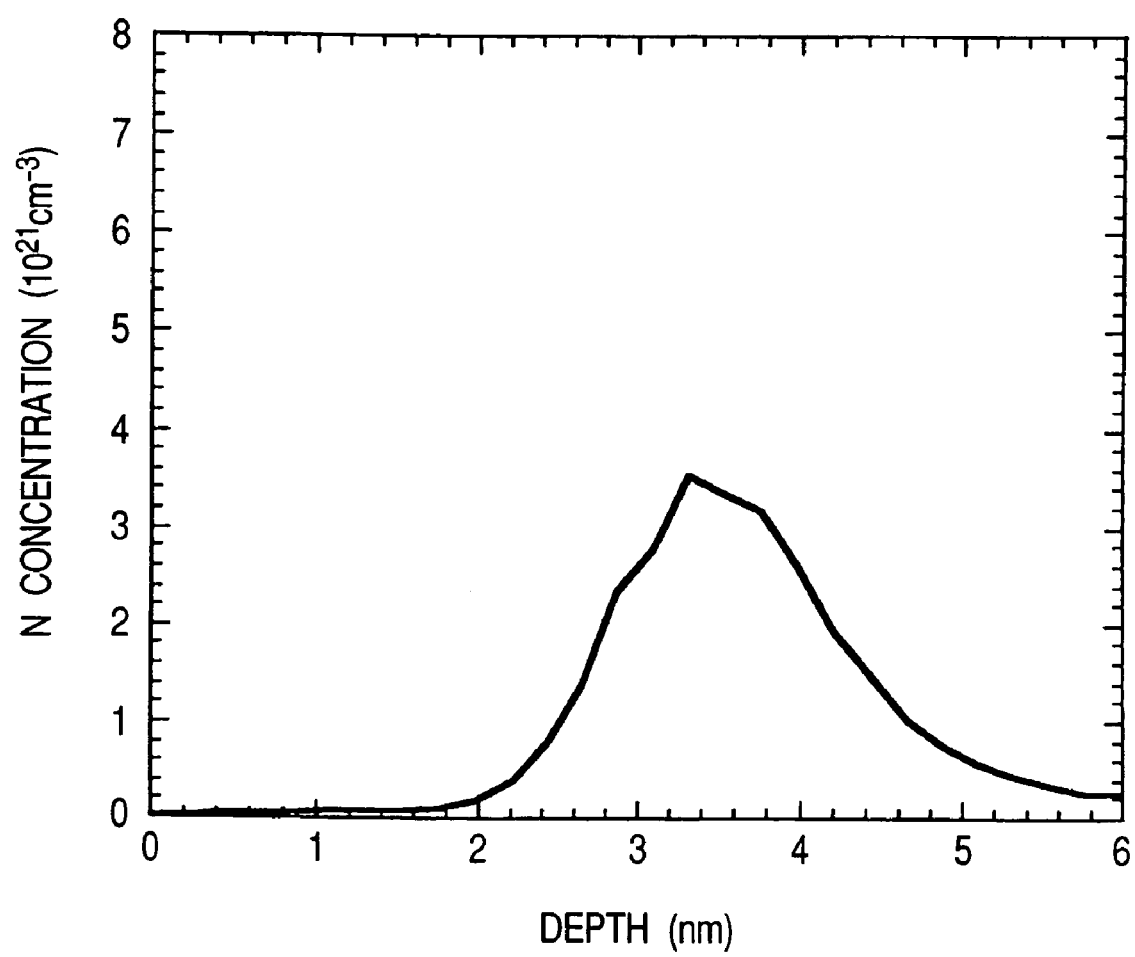
FIG. 6 is a graph showing the profile of nitrogen concentration in a silicon oxynitride film formed by an oxynitridation treatment.

FIG. 6 is a graph showing the profile of nitrogen concentration in the silicon oxynitride film 6b formed by the above heat treatment (oxynitridation treatment, and the horizontal axis shows the depth (nm) from the surface of the substrate 1.

As shown in the graph, the concentration of nitrogen in the silicon oxynitride film 6b is the highest near the interface between the silicon oxynitride film 6b and the substrate 1 (depth of 3.4 nm). This shows that NO introduced into the silicon oxide film 6a diffuses near the surface of the film without reacting with silicon and segregates at the interface with the substrate 1 because the reactivity of NO with silicon is low.

For the above heat treatment (oxynitridation treatment), the heat treatment conditions are set to ensure that the concentration of nitrogen near the interface between the silicon oxynitride film 6b and the substrate 1 becomes 1 to 10 atomic %. When the concentration of nitrogen near the interface is higher than 10 atomic %, the carrier mobility of the p channel MISFET drops by about 20%, thereby reducing the drain current (Ids) by about 10% and making circuit design difficult practically. When the concentration of nitrogen near the interface is lower than 1 atomic %, the effect of the oxynitridation treatment is not obtained.

Nitrogen is further introduced into the silicon oxynitride film 6b by exposing the above substrate 1 to a nitrogen plasma atmosphere. This nitrogen plasma treatment is carried out with a known plasma treatment apparatus for generating plasma through interaction between an electric field and a magnetic field by introducing high frequency waves into a treatment chamber provided with a magnetic field coil therearound. A remote plasma treatment apparatus in which plasma generated in a plasma generator separate from the treatment chamber is introduced into the treatment chamber may be used.

Figure 7:
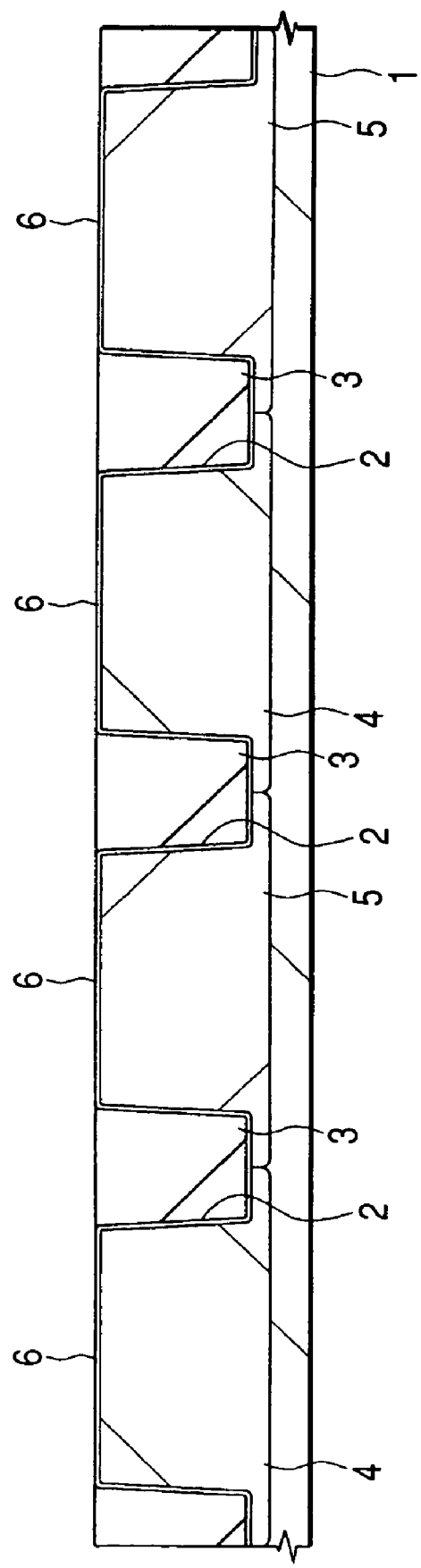
FIG. 7 is a sectional view of the principal portion of a semiconductor substrate showing the method of manufacturing a semiconductor integrated circuit device according to the above embodiment of the present invention.

When the substrate 1 is placed in the treatment chamber of the above plasma treatment apparatus and a nitrogen gas is introduced into the treatment chamber, nitrogen radicals activated by plasma are introduced into the silicon oxynitride film 6b and react with silicon contained in the film to form a silicon oxynitride gate insulating film 6 having a higher concentration of nitrogen than the silicon oxynitride film 6b (FIG. 7).

Figure 8:
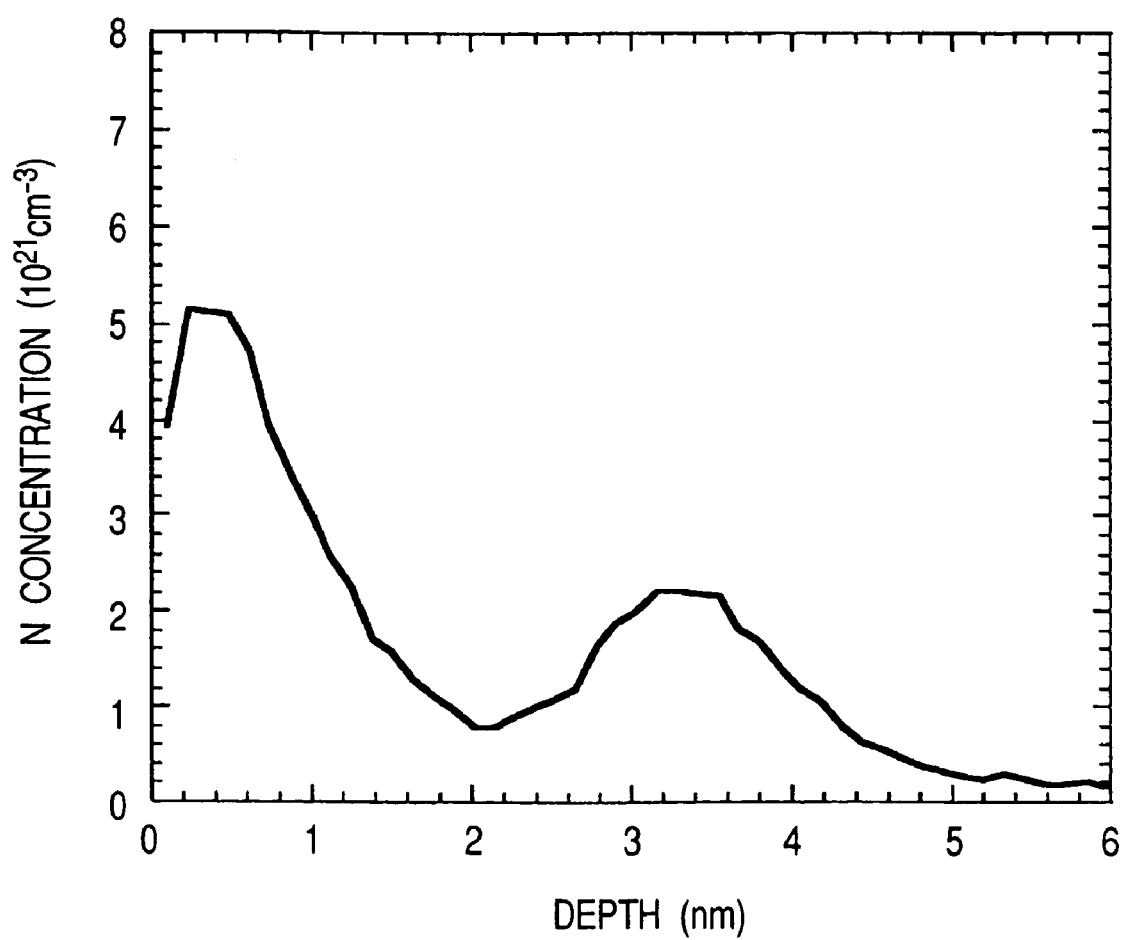
FIG. 8 is a graph showing the profile of nitrogen concentration in a gate insulating film made from silicon oxynitride formed by an oxynitridation treatment and a plasma treatment.

FIG. 8 is a graph showing the profile of nitrogen concentration in the gate insulating film 6 made from silicon oxynitride formed by the above oxynitridation treatment and plasma treatment and the horizontal axis shows the depth (nm) from the surface of the substrate 1.

As shown in the graph, the concentration of nitrogen in the gate insulating film 6 has a first peak near the interface between the substrate 1 and the gate insulating film 6 and a second peak near the surface of the gate insulating film 6. Nitrogen existent near the interface between the substrate 1 and the insulating film 6 is mainly introduced by the above oxynitridation treatment and nitrogen existent near the surface of the gate insulating film 6 is mainly introduced by the nitrogen plasma treatment. That is, since active nitrogen introduced by the nitrogen plasma treatment has higher reactivity with silicon than nitrogen introduced by the oxynitridation treatment, most of it reacts with silicon near the surface of the silicon oxynitride film 6b. Meanwhile, since nitrogen introduced by the oxynitridation treatment has low reactivity as described above, most of it diffuses in the film and segregates at the interface with the substrate 1.

Since the effect of reducing a leak current becomes greater as the concentration of nitrogen near the surface of the gate insulating film 6 increases, the concentration of nitrogen in this area is desirably made higher than the upper limit (10 atomic %) of the concentration of nitrogen near the interface between the substrate 1 and the gate insulating film 6.

The above nitrogen plasma treatment is carried out at a low temperature of 600° C. or less to prevent nitrogen introduced into the film from being diffused to the interface with the substrate 1. When the temperature of the substrate 1 is high, nitrogen diffuses to the interface with the substrate 1 and may exceed the above upper limit (10 atomic %) of its concentration. When the nitrogen plasma treatment is carried out at room temperature, the temperature of the substrate 1 rises to about 200° C. due to its exposure to plasma. Therefore, it is desired to heat the substrate at 200° C. or higher in order to ensure the controllability of the process.

The order of the oxynitridation treatment and the nitrogen plasma treatment may be reversed. That is, after the nitrogen plasma treatment, the oxynitridation treatment may be carried out. Since the oxynitridation treatment is accompanied by heating at a high temperature (900 to 1,100° C.), when the oxynitridation treatment is carried out after the nitrogen plasma treatment, nitrogen near the surface of the gate insulating film 6 introduced by the nitrogen plasma treatment diffuses near the interface with the substrate 1 at the time of the oxynitridation treatment, thereby increasing the concentration of nitrogen in this area to a higher level than required. Therefore, the treatment conditions must be set by taking this into account.

Figure 9:
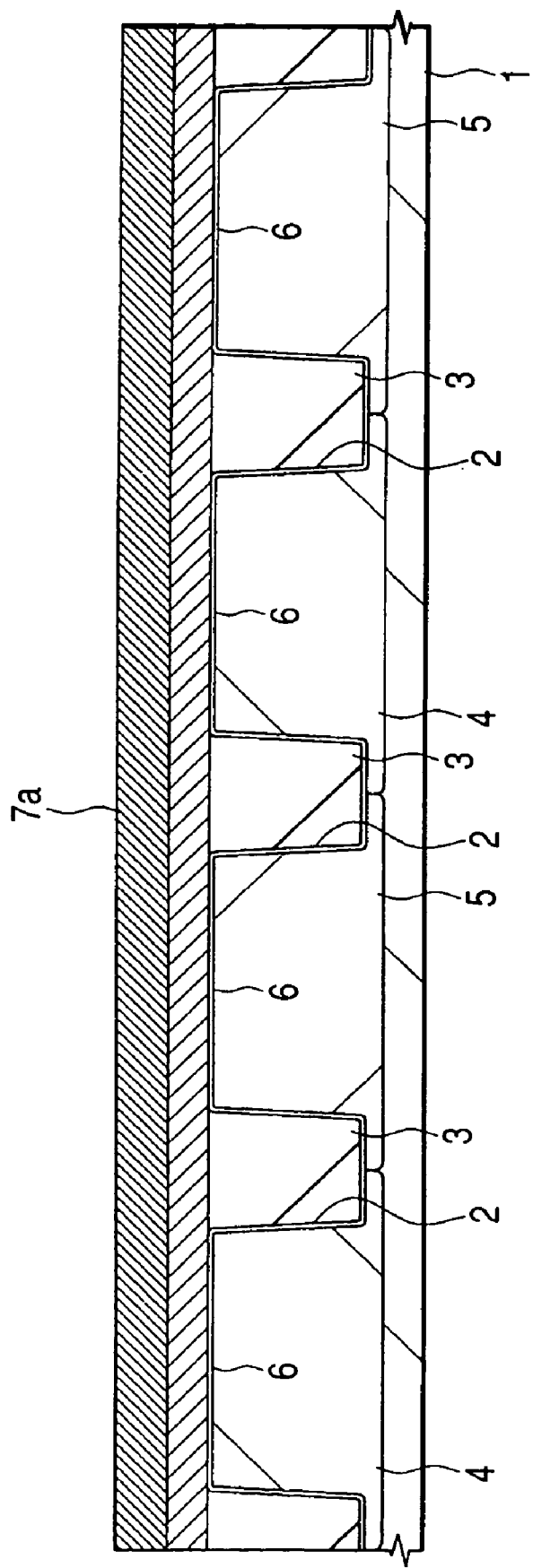
FIG. 9 is a sectional view of the principal portion of a semiconductor substrate showing the method of manufacturing a semiconductor integrated circuit device according to the above embodiment of the present invention.

As shown in FIG. 9, a conductive film 7a for gate electrodes is then deposited on the gate insulating film 6. The conductive film 7a for gate electrodes is a laminate (polycide film) consisting of an n type polycrystal silicon film deposited by CVD and a W (tungsten) silicide film, or a laminate (polymetal film) consisting of an n type polycrystal silicon film deposited by CVD, a tungsten nitride (WN) film deposited by sputtering and a W film.

Figure 10:
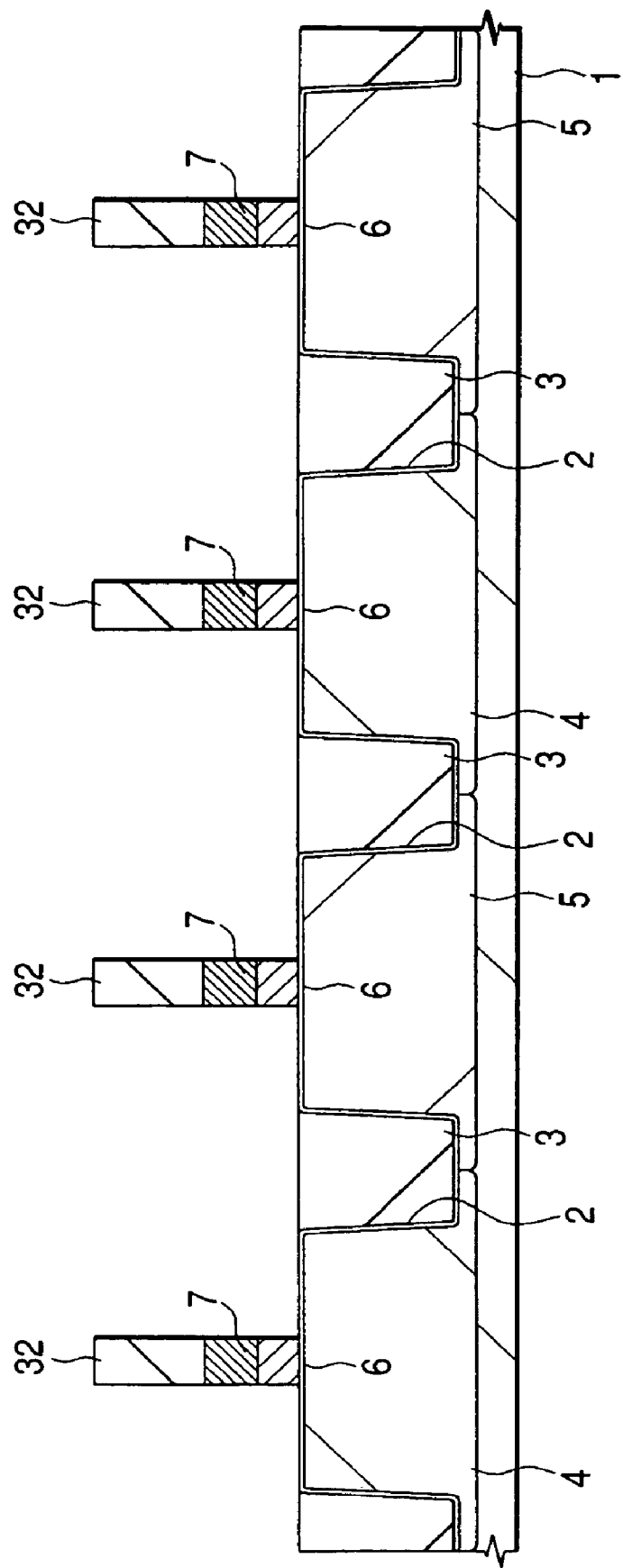
FIG. 10 is a sectional view of the principal portion of a semiconductor substrate showing the method of manufacturing a semiconductor integrated circuit device according to the above embodiment of the present invention.

As shown in FIG. 10, gate electrodes 7 are then formed on the gate oxide films 6 of the p type wells 4 and the n type wells 5 by patterning the conductive film 7a for gate electrodes by dry etching with the photomask film 32 as a mask.

Figure 11:
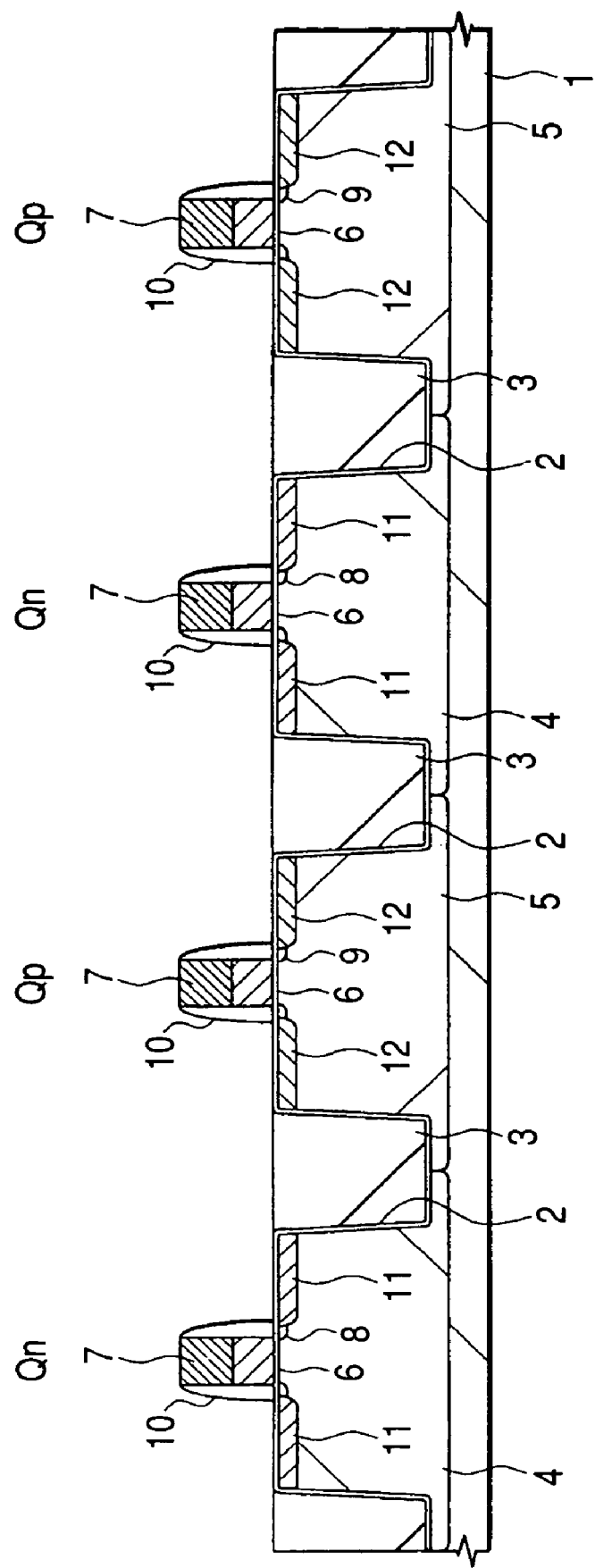
FIG. 11 is a sectional view of the principal portion of a semiconductor substrate showing the method of manufacturing a semiconductor integrated circuit device according to the above embodiment of the present invention.

After the photoresist films 32 on the gate electrodes 7 are removed by an ashing treatment, as shown in FIG. 11, phosphorus or arsenic ions are injected into the p type wells 4 to form $n^-$ type semiconductor areas 8 having a low content of an impurity and boron ions are injected into the n type wells 5 to form $p^-$ type semiconductor areas 9 having a low content of an impurity.

A silicon nitride film is then deposited on the substrate 1 by CVD and then etched anisotropically to form a side wall spacer 10 on the side walls of the gate electrodes 7, phosphorus or arsenic ions are injected into the p type wells 4 to form $n^+$ type semiconductor areas 11 (source, drain) having a high content of an impurity, and phosphorus ions are injected into the n type wells 5 to form $p^+$ type semiconductor areas 12 (source, drain) having a high content of an impurity. N channel MISFET's (Qn) and p channel MISFET's (Qp) are completed by the above steps.

Figure 12:
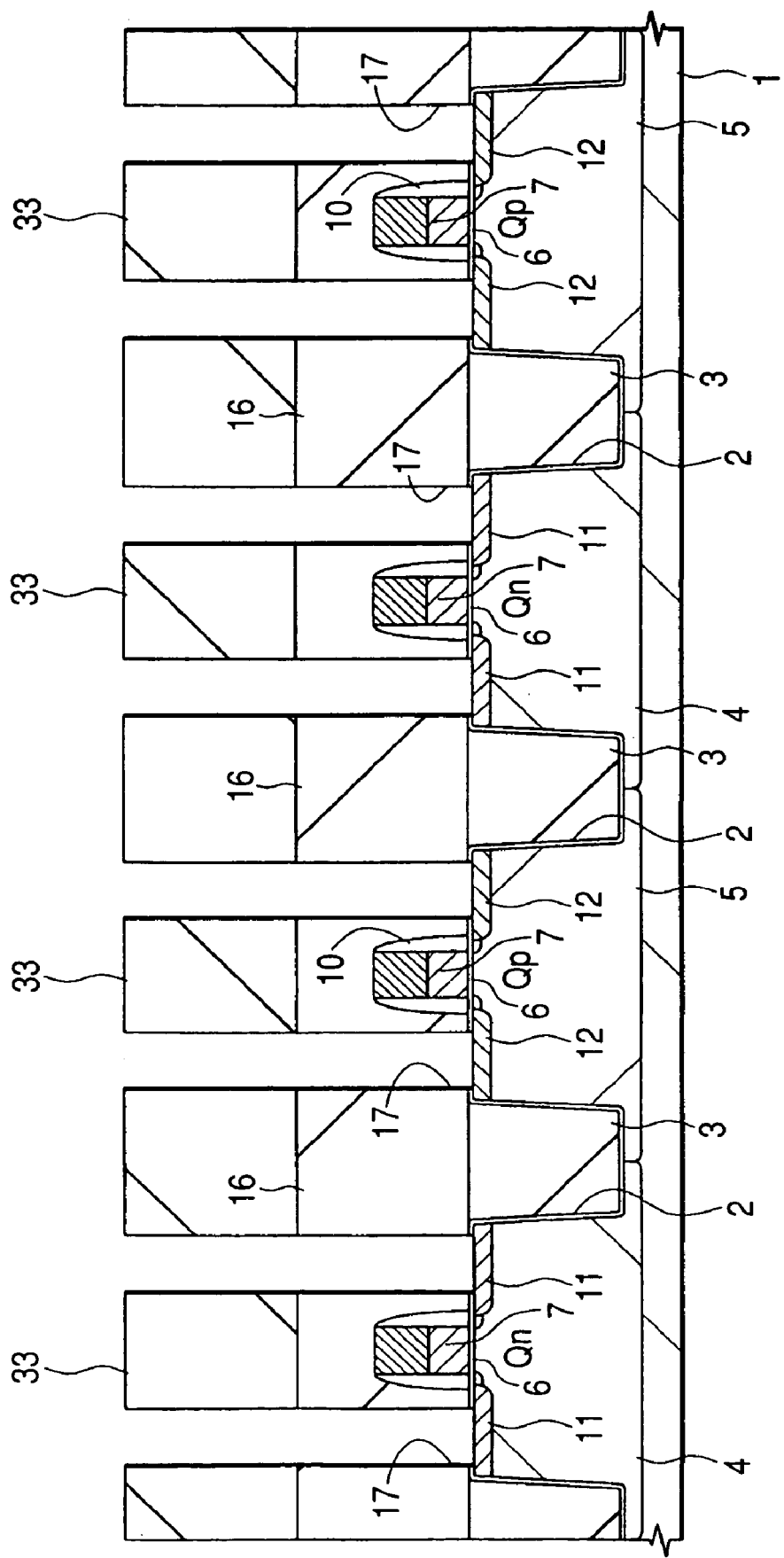
FIG. 12 is a sectional view of the principal portion of a semiconductor substrate showing the method of manufacturing a semiconductor integrated circuit device according to the above embodiment of the present invention.

As shown in FIG. 12, contact holes 17 are formed above the source and drain (n⁺ type semiconductor areas 11) of the n channel MISFET's (Qn) and the source and drain (p⁺ type semiconductor areas 12) of the p channel MISFET's (Op) by dry etching a silicon oxide film 16 with a photoresist film 33 as a mask.

Figure 13:
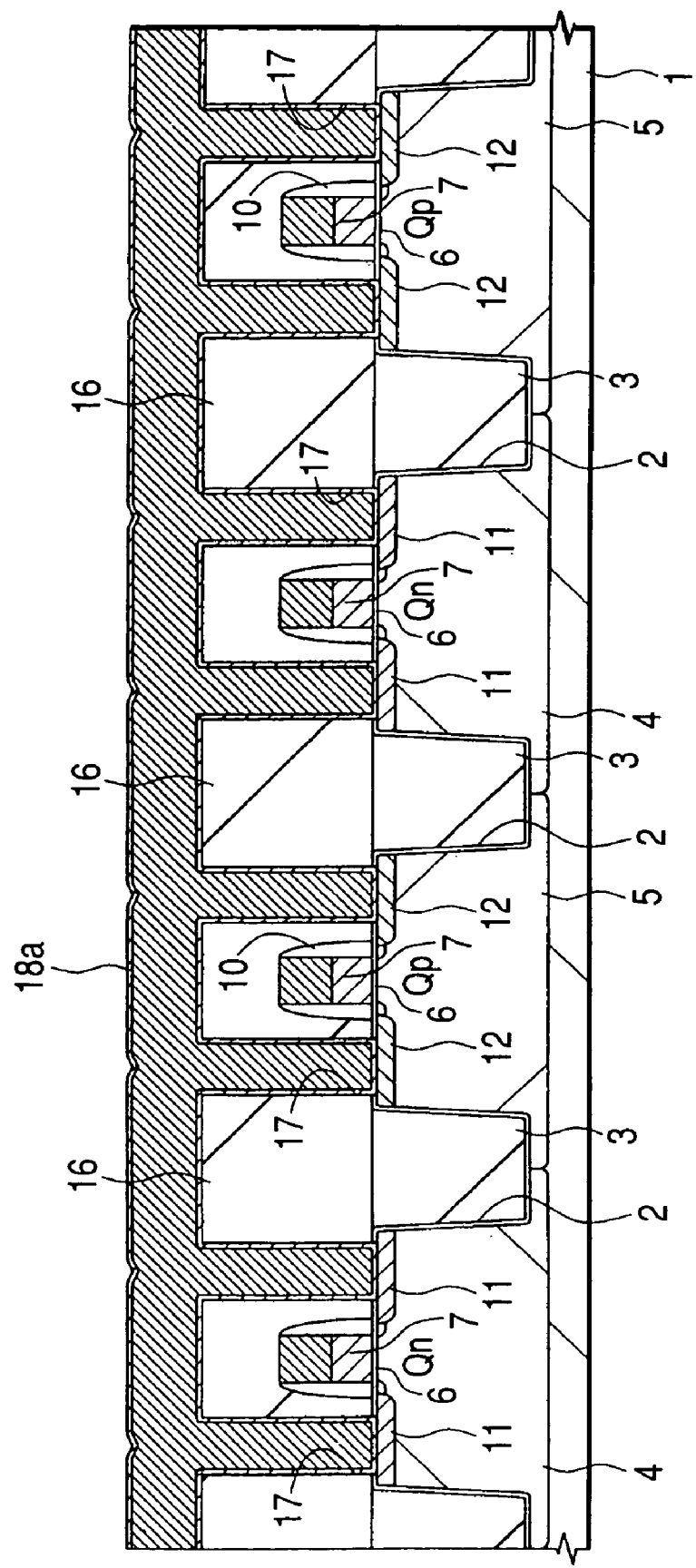
FIG. 13 is a sectional view of the principal portion of a semiconductor substrate showing the method of manufacturing a semiconductor integrated circuit device according to the above embodiment of the present invention.

After the photoresist film 33 on the silicon oxide film 16 is removed by the ashing treatment or the like, as shown in FIG. 13, a metal film 18a for wiring is deposited on the silicon oxide film 16 including the insides of the contact holes 17 by sputtering. The metal film 18a for wiring is an Al alloy film or a composite metal film consisting of an Al alloy film as a lower layer and a Ti film or TiN film as an upper layer.

Figure 14:
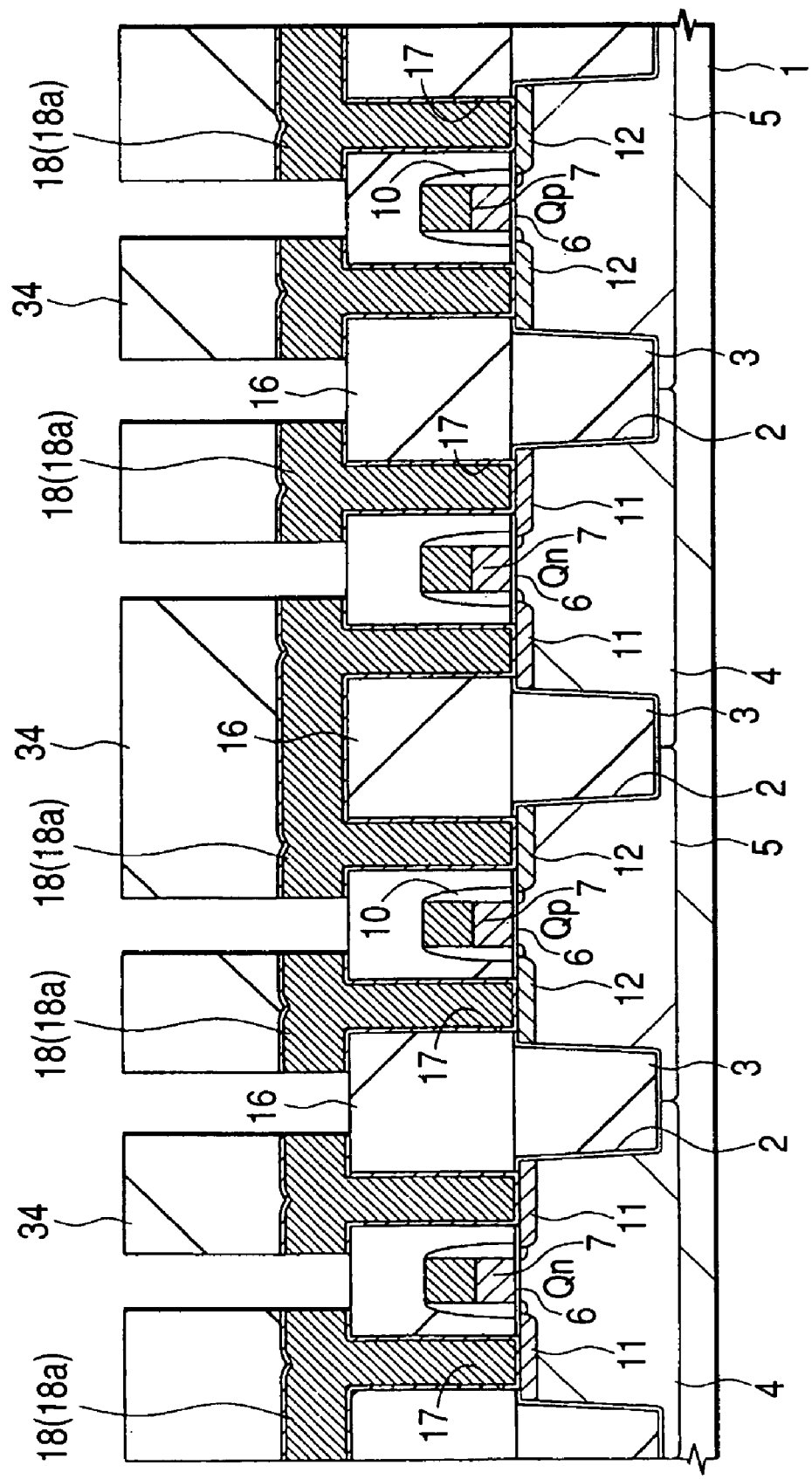
FIG. 14 is a sectional view of the principal portion of a semiconductor substrate showing the method of manufacturing a semiconductor integrated circuit device according to the above embodiment of the present invention.

As shown in FIG. 14, after a photoresist film 34 is formed on the metal film 18a for wiring, a first metal wiring 18 which is the metal film 18a for wiring is formed on the silicon oxide film 16 by dry etching the metal film 18a for wiring with the photoresist film 34 as a mask.

Figure 15:
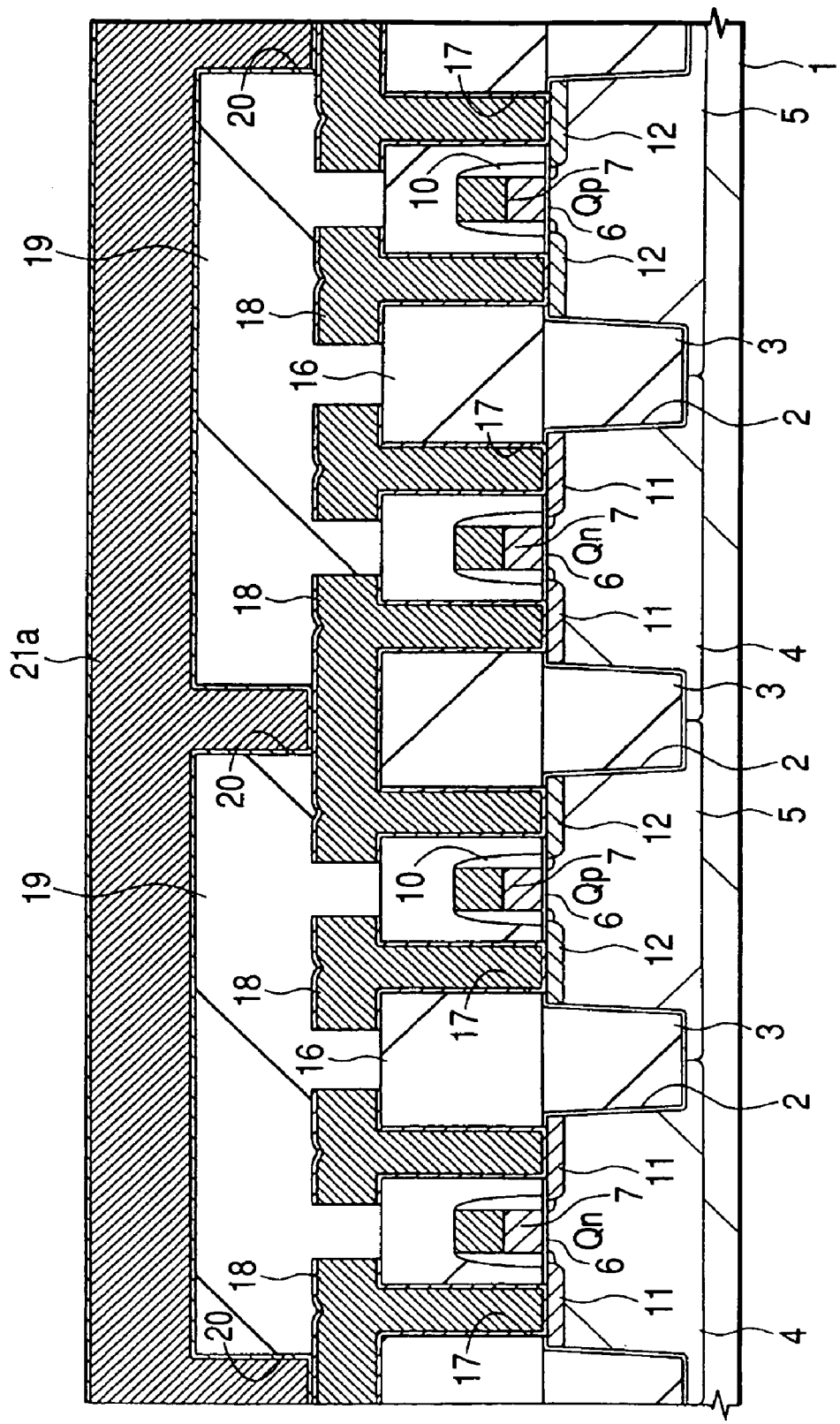
FIG. 15 is a sectional view of the principal portion of a semiconductor substrate showing the method of manufacturing a semiconductor integrated circuit device according to the above embodiment of the present invention.

After the photoresist film 34 on the metal wiring 18 is removed by the ashing treatment, as shown in FIG. 15, a silicon oxide film 19 is deposited on the metal wiring 18 by CVD and dry etched to form through holes 20, and a metal film for wiring is deposited on the silicon oxide film 19 including the insides of the through holes 20 by sputtering and dry etched to form a second metal wiring 21 over the silicon oxide film 19.

Not illustrated, interlayer insulating films and wirings are formed alternately on the second metal wiring 21 by repetitions of the above wiring forming step to accomplish the CMOS-LSI of this embodiment.

Since the gate insulating film 6 is formed from silicon oxynitride by using both the oxynitridation treatment and the nitrogen plasma treatment in this embodiment, the concentration of nitrogen in the film can be increased without raising the concentration of nitrogen near the interface between the substrate 1 and the gate insulating film 6 to a higher level than required.

As the gate insulating film 6 having a high dielectric constant can be thereby formed without reducing the carrier mobility of the p channel MISFET's (Qp), the leak current of the MISFET's (n channel MISFET's (Qn) and p channel MISFET's (Qp)) can be reduced. Further, the hot carrier resistance of MISFET's (n channel MISFET's (Qn) and p channel MISFET's (Qp)) and the electron mobility of the n channel MISFET's can be improved.

Since the oxynitridation treatment which requires a heat treatment at a high temperature is carried out only once, the excessive growth of the gate insulating film 6 can be suppressed, thereby making it possible to obtain a gate insulating film 6 having a thickness of 5 nm or less.

Embodiment 2

The semiconductor integrated circuit device of this embodiment is a DRAM-logic hybrid LSI having a DRAM (Dynamic Random Access Memory) and a logic circuit formed on the same semiconductor substrate. The method of manufacturing this hybrid LSI will be described in the order of steps with reference to FIGS. 16 to 26. The left and center areas in these figures are a DRAM memory cell forming area (to be referred to as "DRAM forming area" hereinafter) and the right area is a logic circuit forming area.

Figure 16:
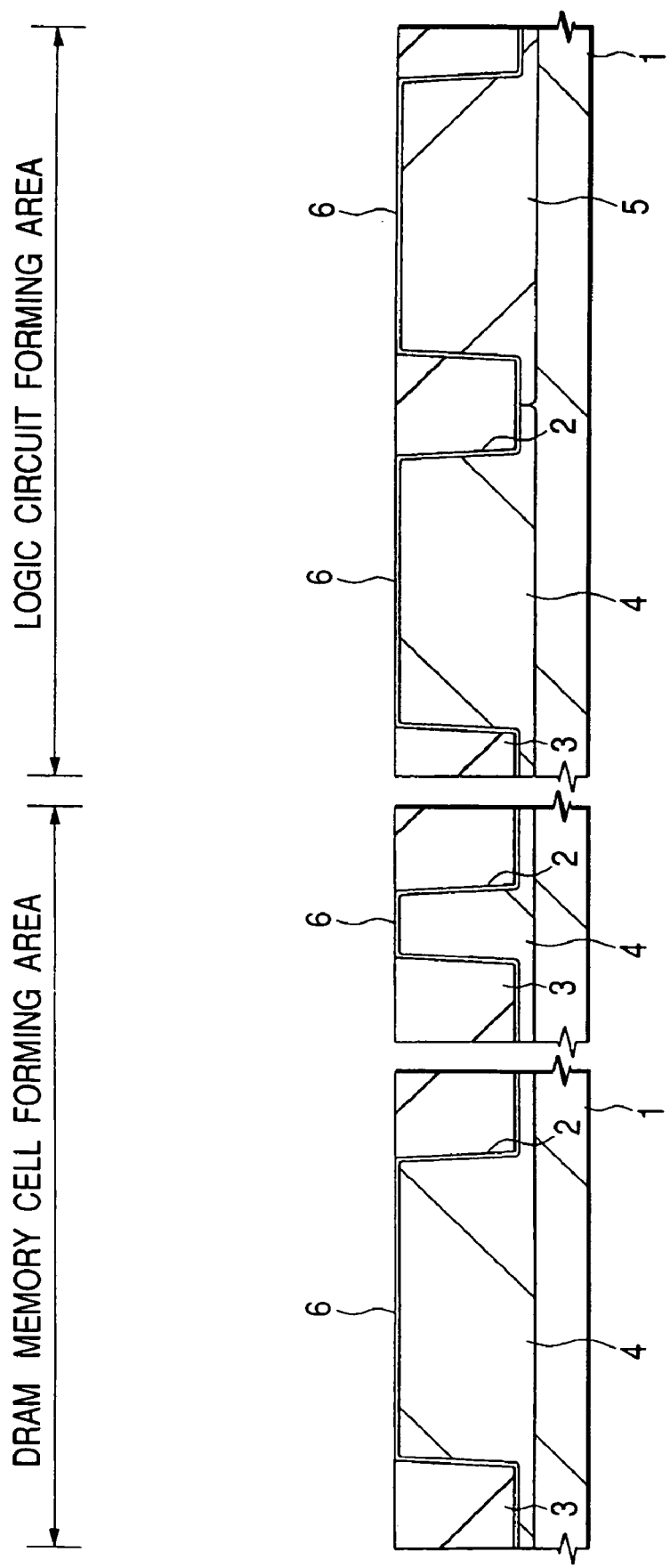
FIG. 16 is a sectional view of the principal portion of a semiconductor substrate showing a method of manufacturing a semiconductor integrated circuit device according to another embodiment of the present invention.

As shown in FIG. 16, element separation grooves 2, p type wells 4 and an n type well 5 are first formed on the main surface of a substrate 1 in the same manner as in the above Embodiment 1, a silicon oxide film 6a is formed on the surfaces of the p type wells 4 and the n type well 5, nitrogen is introduced into the silicon oxide film 6a by using both of the above oxynitridation treatment and nitrogen plasma treatment to form a silicon oxynitride gate insulating film 6 having a thickness of 1.5 nm on the surfaces of the p type wells 4 and the n type well 5. The concentration of nitrogen in the gate insulating film 6 has a first peak near the interface with the substrate 1 and a second peak (10 atomic % or more) higher than the first peak near the surface of the film like the gate insulating film 6 of the above Embodiment 1.

Figure 17:
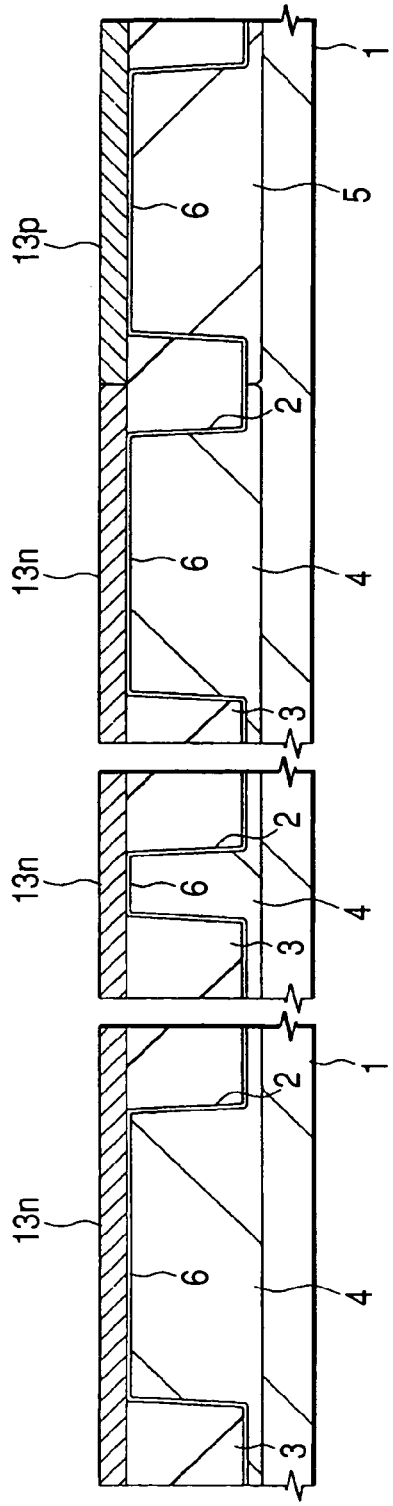
FIG. 17 is a sectional view of the principal portion of a semiconductor substrate showing the method of manufacturing a semiconductor integrated circuit device according to the another embodiment of the present invention.

As shown in FIG. 17, an n type polycrystal silicon film 13n is formed on the gate insulating film 6 of the p type wells 4 and a p type polycrystal silicon film 13p is formed on the gate insulating film 6 of the n type well 5. To form the n type polycrystal silicon film 13n and the p type polycrystal silicon film 13p, an amorphous silicon film is first formed on the gate insulating film 6 by CVD, phosphorus ions are injected into the amorphous silicon film overlying the p type wells 4 by using a photoresist film as a mask, boron ions are injected into the amorphous silicon film overlying the n type well 5, and the substrate 1 is heated. The injection of the above ions is carried out to change n channel MISFET's for forming the memory cells of a DRAM and an n channel MISFET and a p channel MISFET for forming a logic circuit into surface channel MISFET's.

Figure 18:
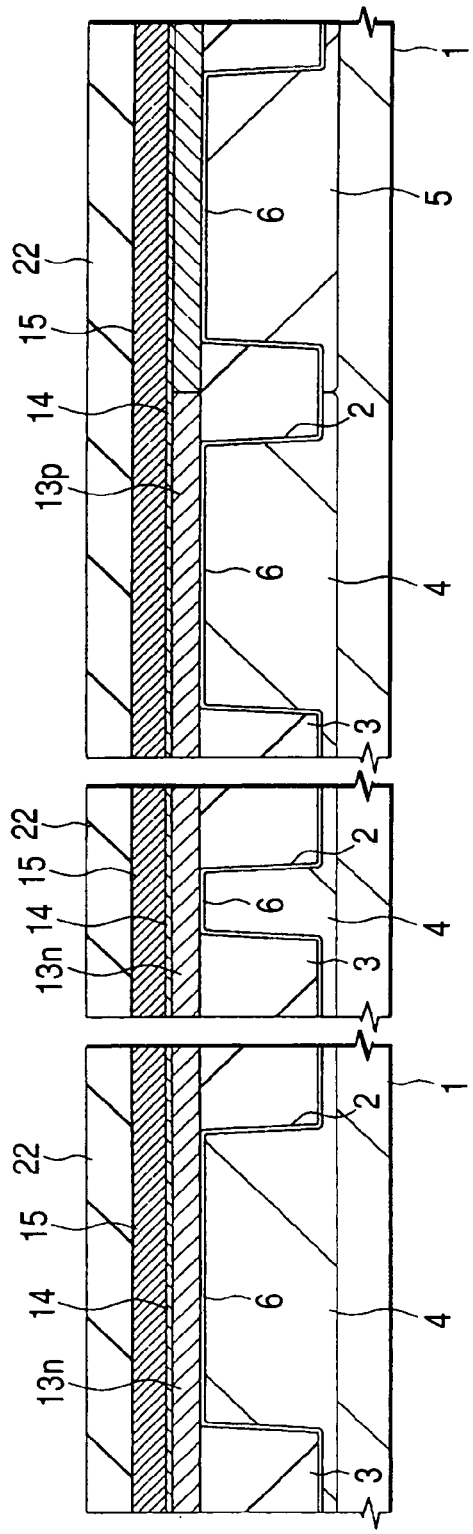
FIG. 18 is a sectional view of the principal portion of a semiconductor substrate showing the method of manufacturing a semiconductor integrated circuit device according to the another embodiment of the present invention.
Figure 19:
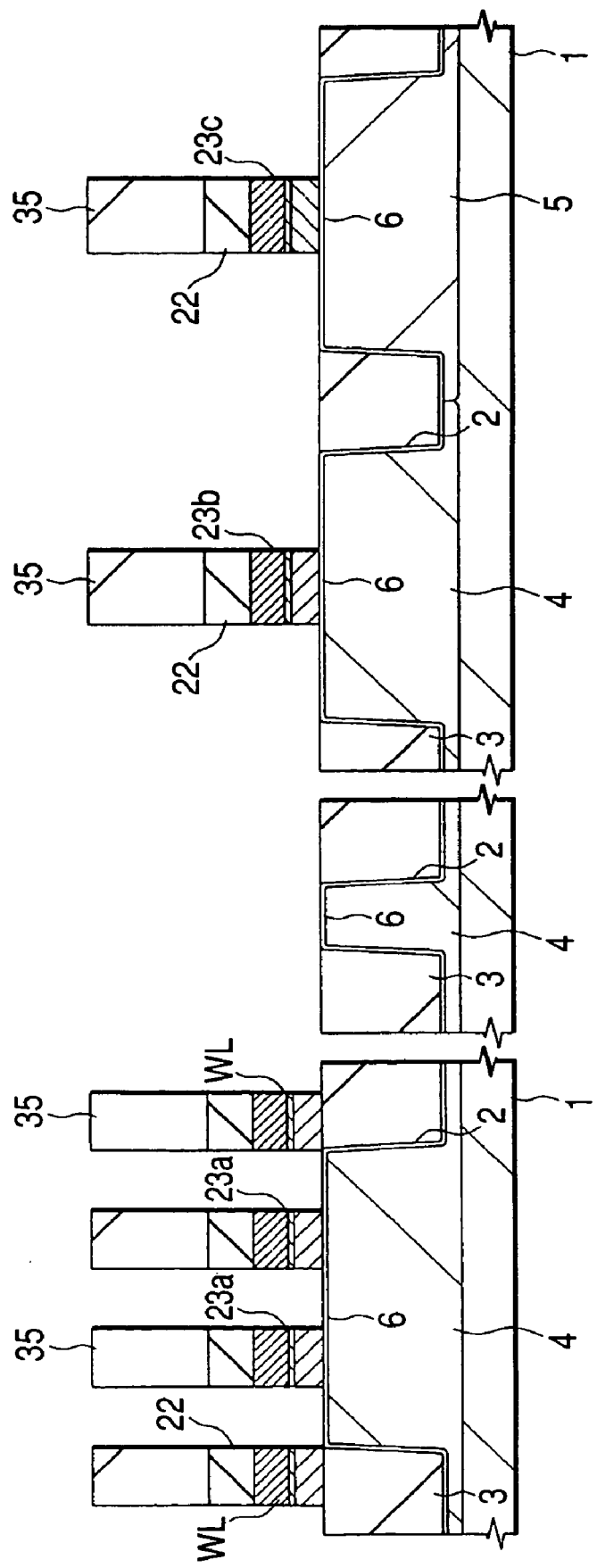
FIG. 19 is a sectional view of the principal portion of a semiconductor substrate showing the method of manufacturing a semiconductor integrated circuit device according to the another embodiment of the present invention.

After a $WN_x$ film 14, W film 15 and silicon nitride film 22 are deposited on the polycrystal silicon films (13p, 13n) as shown in FIG. 18, the silicon nitride film 22, W film 15, $WN_x$ film 14 and polycrystal silicon films (13p, 13n) are dry etched by using a photoresist film 35 as a mask, to form gate electrodes 23a (word lines WL) on the gate insulating film 6 of the DRAM forming area and form gate electrodes 23b and 23c on the gate insulating film 6 of the logic circuit forming area as shown in FIG. 19.

Figure 20:
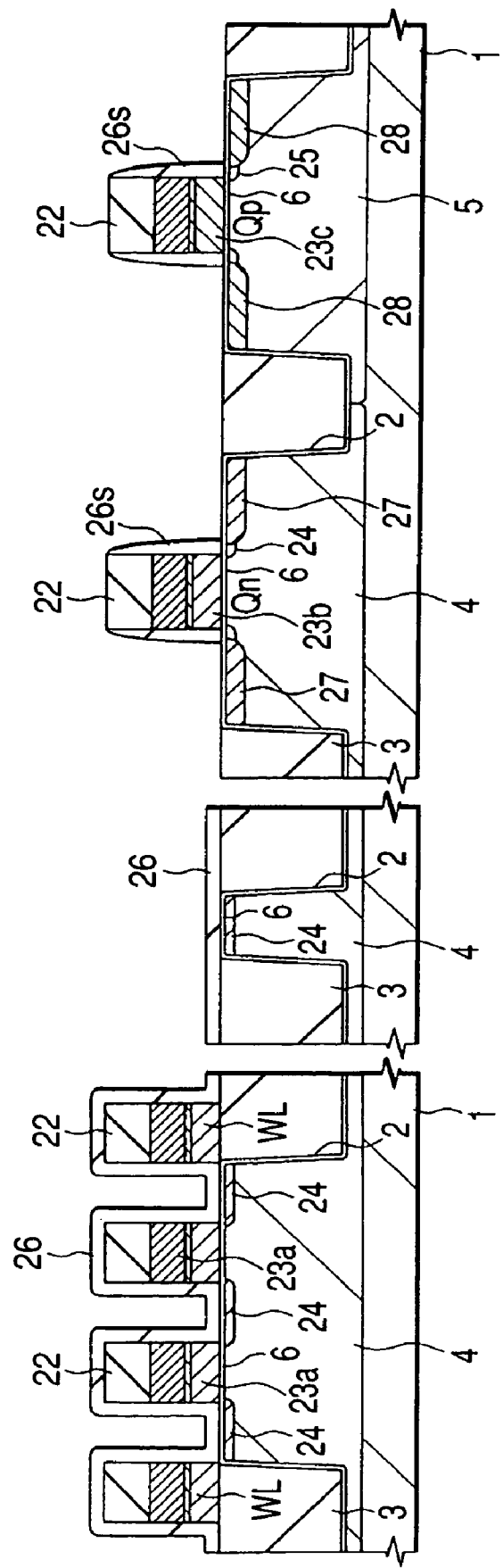
FIG. 20 is a sectional view of the principal portion of a semiconductor substrate showing the method of manufacturing a semiconductor integrated circuit device according to the another embodiment of the present inventions.

After the photoresist film 35 is removed, as shown in FIG. 20, phosphorus or arsenic ions are injected into the p type wells 4 to form n⁻ type semiconductor areas 24 having a low content of an impurity and boron ions are injected into the n type well 5 to form p⁻ type semiconductor areas 25 having a low content of an impurity.

A silicon nitride film 26 is then deposited on the substrate 1, a side wall spacer 26s is formed on the side walls of the gate electrodes 23b and 23c by etching the silicon nitride film 26 of the logic circuit forming area anisotropically, phosphorus or arsenic ions are injected into the p type wells 4 of the logic circuit forming area to form n⁺ type semiconductor areas 27 (source, drain) having a high content of an impurity, and boron ions are injected into the n type well 5 to form p⁺ type semiconductor areas 28 (source, drain) having a high content of an impurity. The n channel MISFET (Qn) and p channel MISFET (Qp) of the logic circuit are completed by the above steps.

Figure 21:
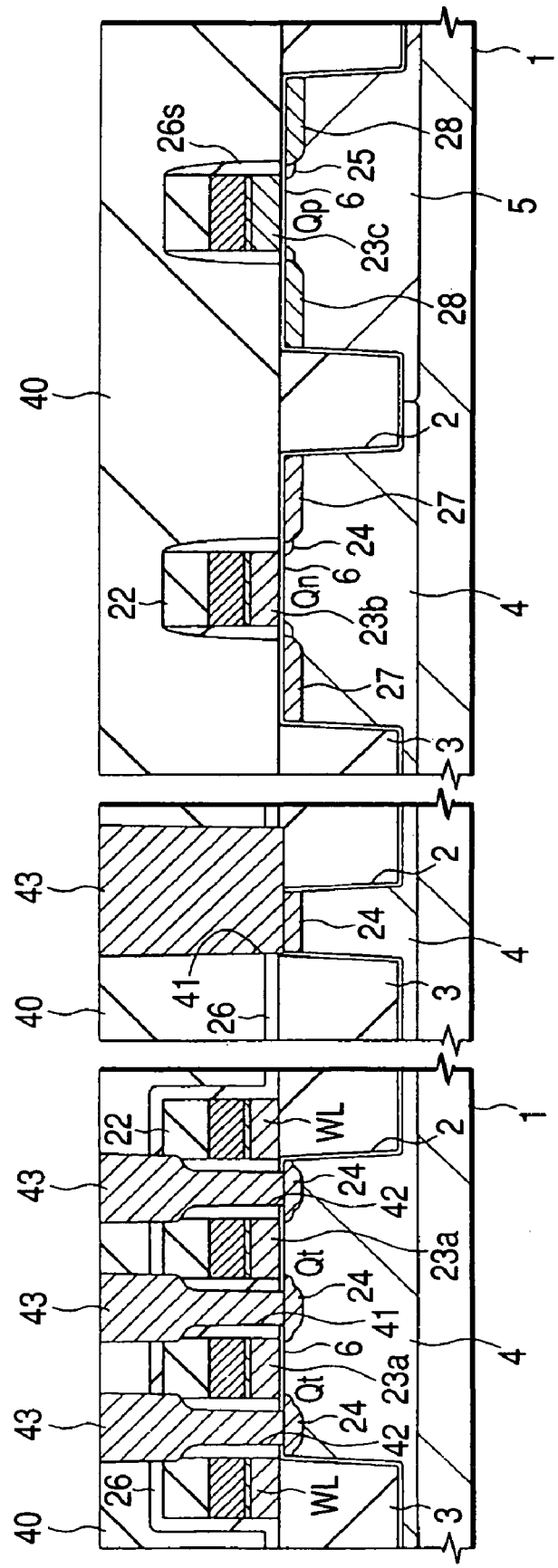
FIG. 21 is a sectional view of the principal portion of a semiconductor substrate showing the method of manufacturing a semiconductor integrated circuit device according to the another embodiment of the present invention.

As shown in FIG. 21, a silicon oxide film 40 is deposited on the gate electrodes 23a, 23b and 23c, contact holes 41 and 42 are formed above the n⁻ type semiconductor areas 24 of the DRAM forming area, and plugs 43 made from n type polycrystal silicon are formed in the insides of the contact holes 41 and 42. Thereafter, the substrate 1 is heated to diffuse the n type impurity (phosphorus) contained in the polycrystal silicon film forming the plugs 43 into the n⁻ type semiconductor areas 24, thereby forming low-resistance source and drain. MISFET's (Qt) for selecting memory cells are in the DRAM forming area by the above steps.

Figure 22:
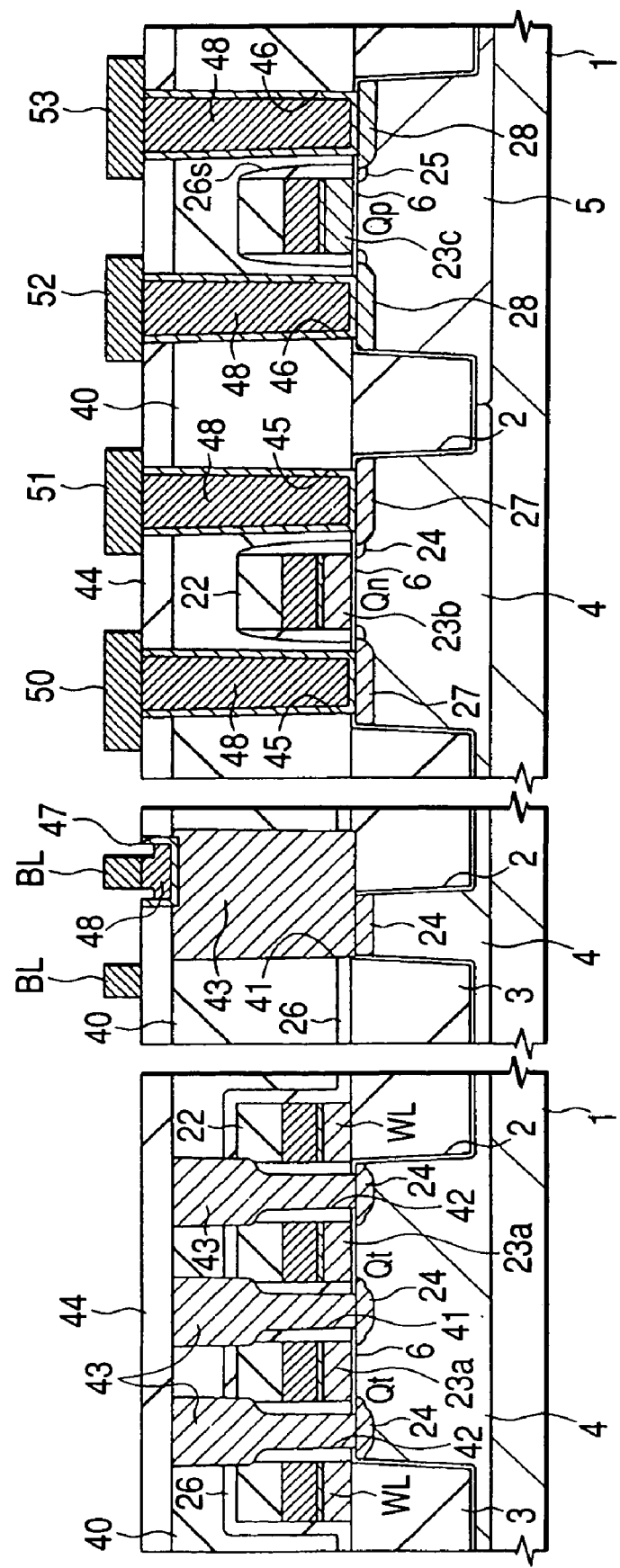
FIG. 22 is a sectional view of the principal portion of a semiconductor substrate showing the method of manufacturing a semiconductor integrated circuit device according to the another embodiment of the present invention.

As shown in FIG. 22, a silicon oxide film 44 is deposited on the silicon oxide film 40, the silicon oxide films 44 and 40 in the logic circuit forming area are dry etched to form contact holes 45 above the source and drain (n⁺ type semiconductor areas 27) of then channel MISFET (Qn) and contact holes 46 above the source and drain (p⁺ type semiconductor areas 28) of the p channel MISFET (Qp). The silicon oxide film 44 in the DRAM forming area is etched to form a through hole 47 above the contact hole 41.

After a plug 48 is formed in the insides of the contact holes 45 and 46 and the through hole 47, bit lines BL are formed above the silicon oxide film 44 of the DRAM forming area, and wires 50 to 53 are formed above the silicon oxide film 44 of the logic circuit forming area. The plug 48 is formed of a laminate consisting of a TiN film and a W film, and the bit lines BL and the wires 50 to 53 are each formed of a W film.

The bit lines BL are electrically connected to one (24) of the source and drain of the memory cell selecting MISFET (Qt) through the through hole 47 and the contact hole 41. The wires 50 and 51 are electrically connected to the source and drain (n⁺ type semiconductor areas 27) of the n channel MISFET (Qn) through the contact holes 45 and 45, and the wires 52 and 53 are electrically connected to the source and drain (p⁺ type semiconductor areas 28) of the p channel MISFET (Qp) through the contact holes 46 and 46.

Figure 23:
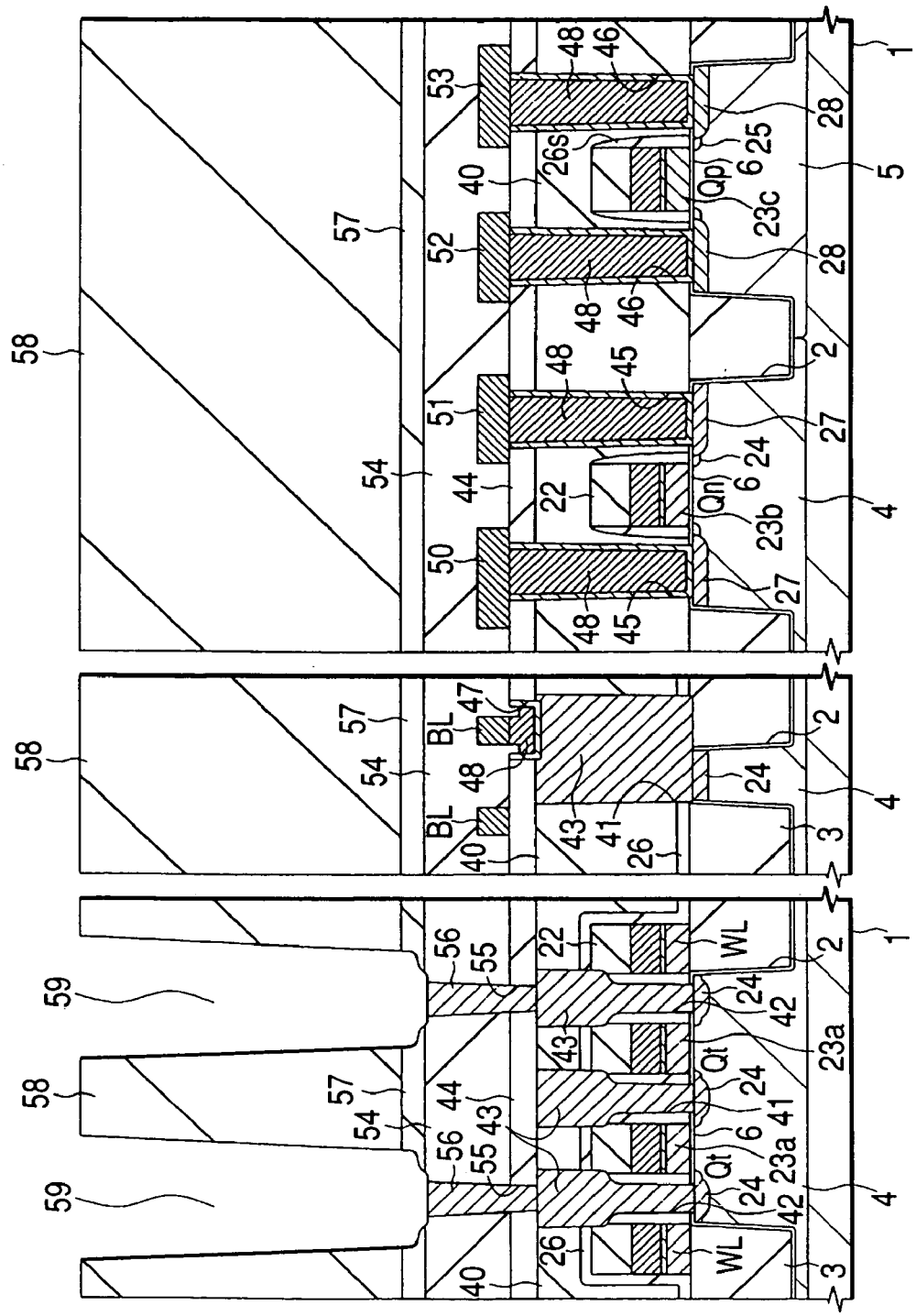
FIG. 23 is a sectional view of the principal portion of a semiconductor substrate showing the method of manufacturing a semiconductor integrated circuit device according to the another embodiment of the present invention.

As shown in FIG. 23, a silicon oxide film 54 is deposited above the bit lines BL and the wires 50 to 53, the silicon oxide films 54 and 44 overlying the contact holes 41 are etched to form through holes 55, and a plug 56 made of an n type polycrystal silicon film is formed in the insides of the through holes 55. Thereafter, a silicon nitride film 57 and a silicon oxide film 58 are deposited on the silicon oxide film 54, and the silicon oxide film 58 and the silicon nitride film 57 overlying the through holes 55 are etched to form grooves 59.

Figure 24:
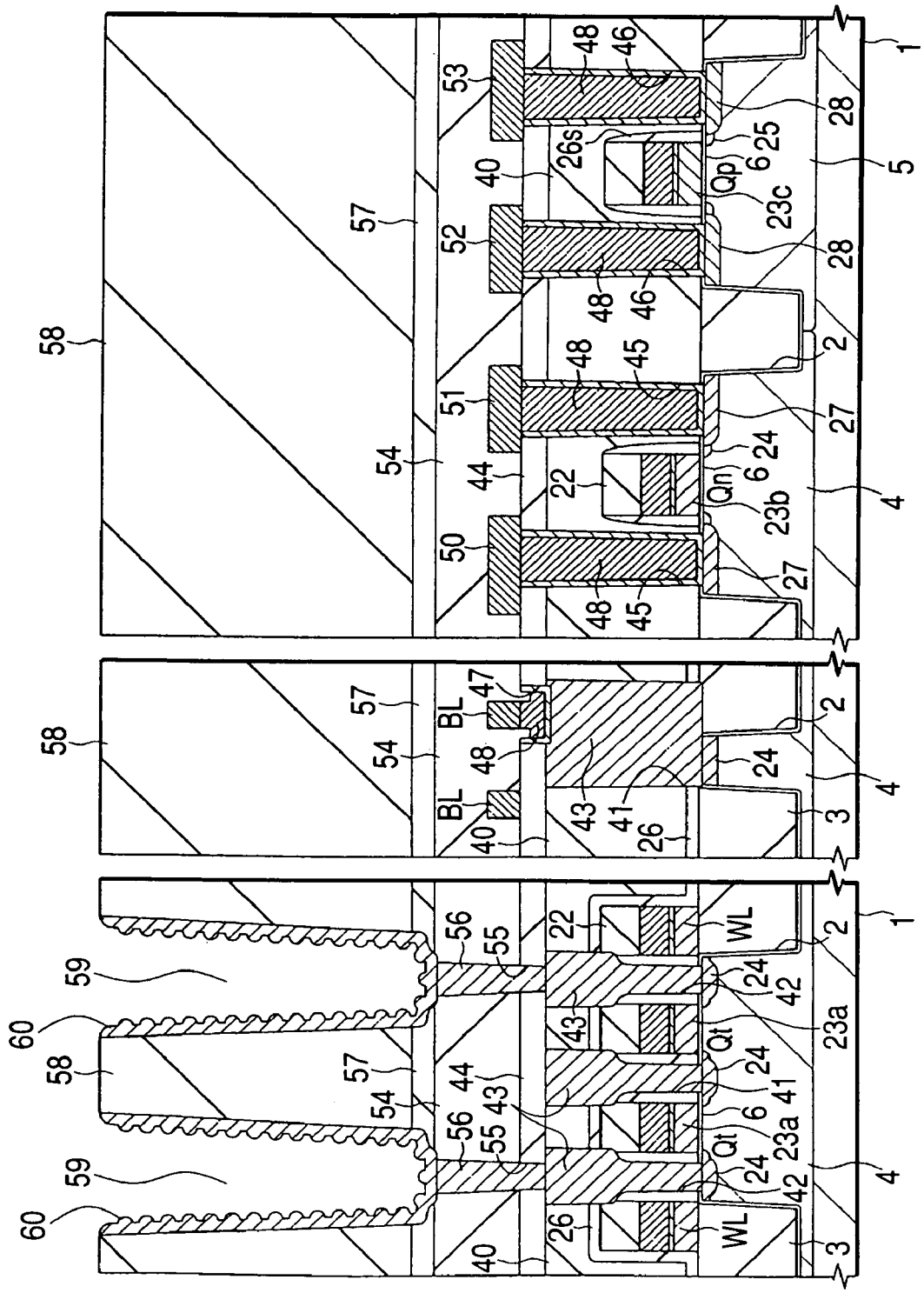
FIG. 24 is a sectional view of the principal portion of a semiconductor substrate showing the method of manufacturing a semiconductor integrated circuit device according to the another embodiment of the present invention.

As shown in FIG. 24, a lower electrode 60 made of a polycrystal silicon film is formed in the inner walls of the grooves 59. To form the lower electrode 60, an n type amorphous silicon film is deposited in the insides of the grooves 60 and above the silicon oxide film 58, and then unrequired portions of the amorphous silicon film on the silicon oxide film 58 are removed. Then, monosilane (SiH₄) is supplied to the surface of the amorphous silicon film in a vacuum atmosphere and the substrate 1 is heated to polycrystalize the amorphous silicon film and grow silicon grains on the surface. Thereby, the lower electrode 60 made of a polycrystal silicon film having a roughened surface is obtained.

Figure 25:
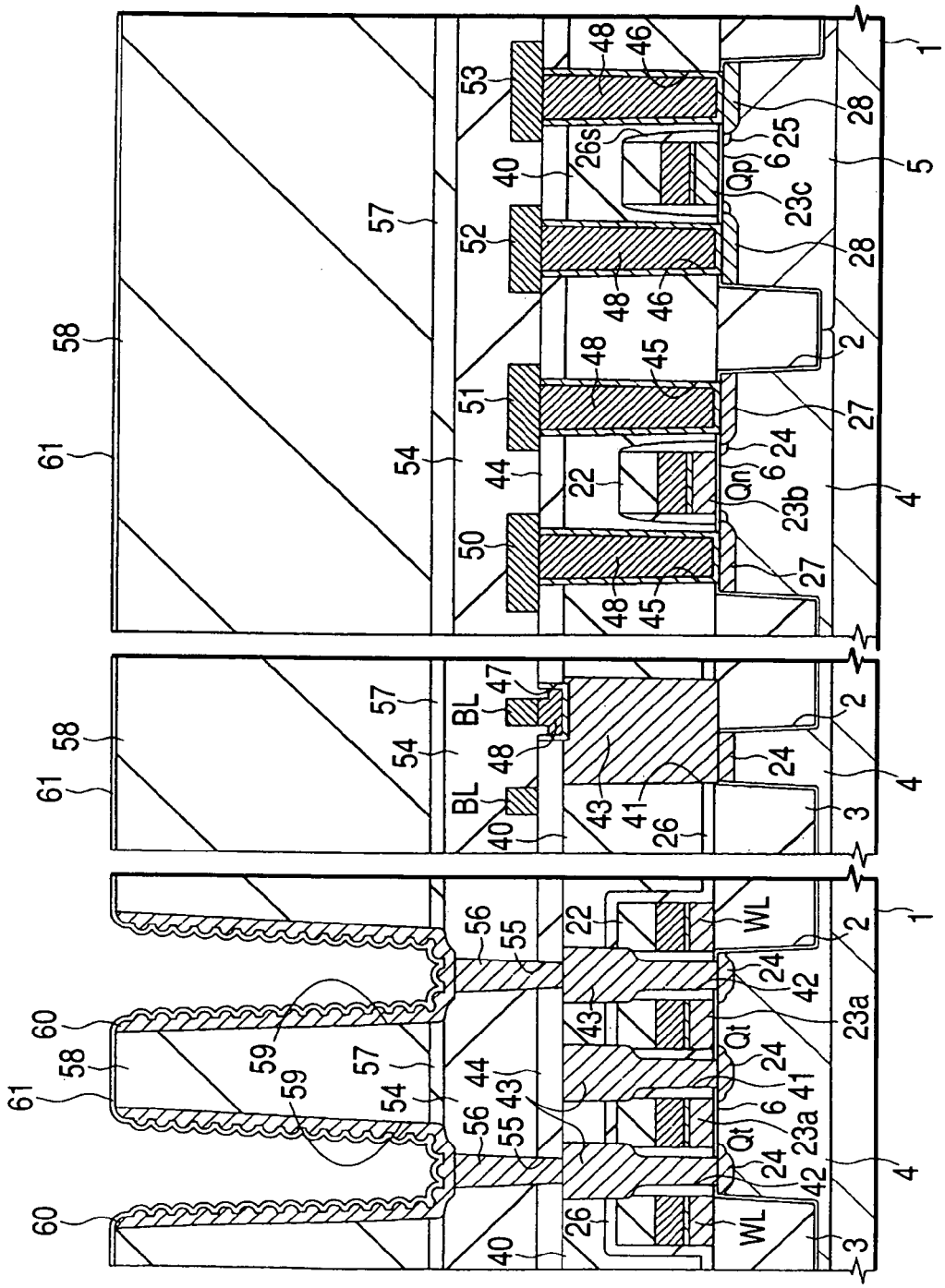
FIG. 25 is a sectional view of the principal portion of a semiconductor substrate showing the method of manufacturing a semiconductor integrated circuit device according to the another embodiment of the present invention.

As shown in FIG. 25, a capacitor insulating film 61 made of a Ta₂O₅ (tantalum oxide) film is formed on the lower electrodes 60 formed in the insides of the grooves 59. The Ta₂O₅ film is deposited by CVD and then the substrate 1 is heated at 700 to 750° C. to modify the film.

As described above, the gate electrode 23c of the p channel MISFET (Qp) constituting part of the logic circuit includes a p type polycrystal silicon film doped with boron (13p). However, since the gate insulating film 6 of the P channel MISFET (Qp) is formed of a silicon oxynitride film having a high concentration of nitrogen, even when a heat treatment for modifying the above Ta₂O₅ film is carried out, boron contained in the p type polycrystal silicon film (13p) can be prevented from going through the gate insulating film 6 to be diffused into the substrate 1 (n type well 5), whereby variations in the threshold voltage of the p channel MISFET (Qp) can be suppressed.

Figure 26:
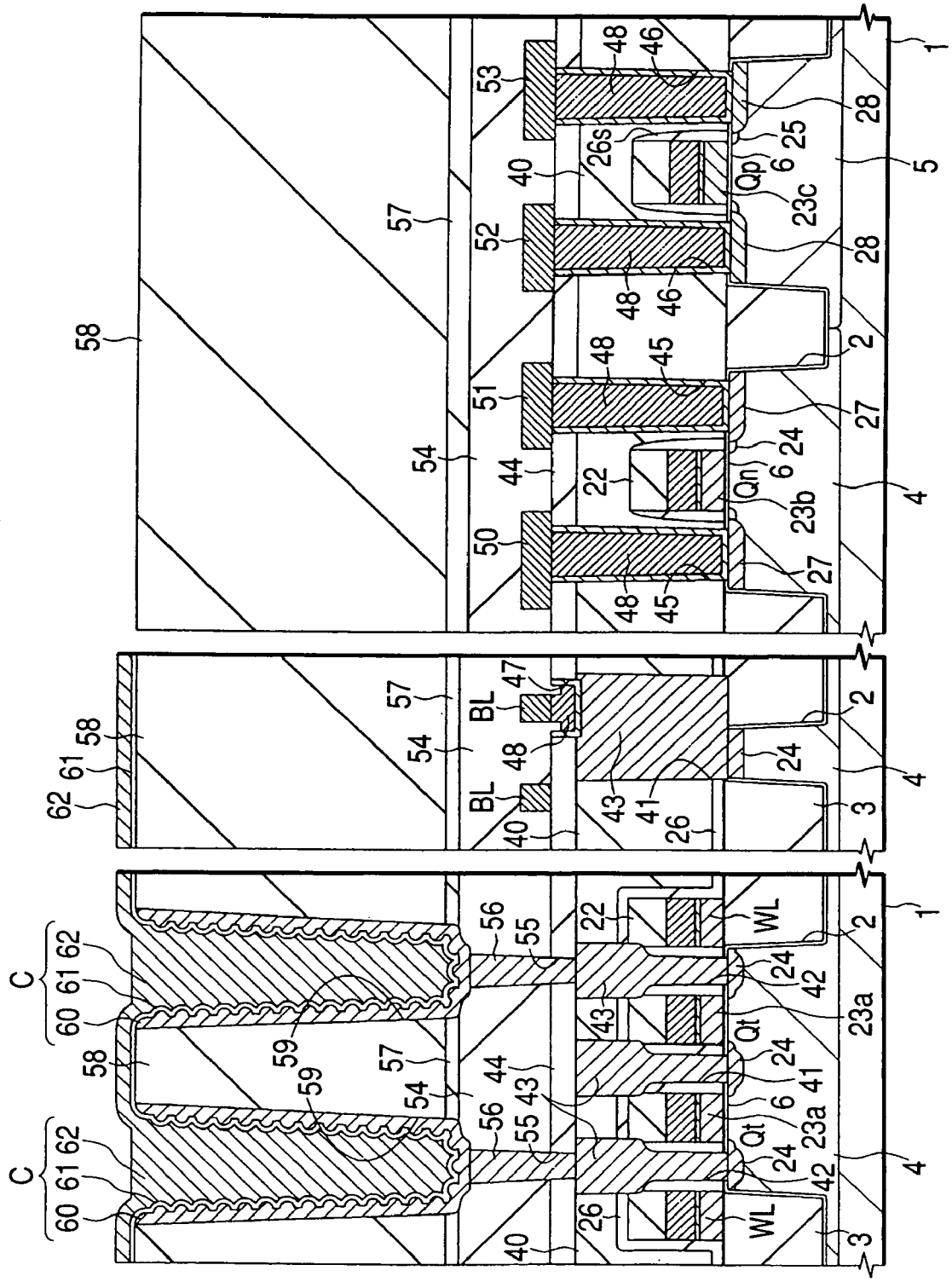
FIG. 26 is a sectional view of the principal portion of a semiconductor substrate showing the method of manufacturing a semiconductor integrated circuit device according to the another embodiment of the present invention.

As shown in FIG. 26, a TiN upper electrode 62 is formed on the capacitor insulating film 61 to manufacture information storage capacitor elements C, each consisting of the lower electrode 60, capacitor insulating film 61 and upper electrode 62. A DRAM memory cell comprising memory cell selecting MISFET's (Qt) and information storage capacitor elements C connected to the MISFET's in series are completed by the above steps.

The capacitor insulating film 61 of the above information storage capacitor element C may be formed of a high dielectric or ferroelectric film having a perovskite or composite perovskite crystal structure such as a PZT, PLT, PLZT, PbTiO₃, SrTiO₃, BaTiO₃, BST, SBT or Ta₂O₅ film besides a Ta₂O₅ film. The lower electrode 60 may be formed of a platinum metal film such as Ru or Pt besides the polycrystal silicon film. When the capacitor insulating film 61 is formed of the above high dielectric film or ferroelectric film and when the lower electrode 60 is formed of the above platinum metal film, a heat treatment is required to modify these films. Since the gate insulating film 6 of the p channel MISFET (Qp) is formed of a silicon oxynitride film having a high concentration of nitrogen, boron contained in the p type polycrystal silicon film (13p) can be prevented from going through the gate insulating film 6 to be diffused into the substrate 1 (n type well 5) even when the above heat treatment is carried out, whereby variations in the threshold voltage of the p channel MISFET (Qp) can be suppressed.

Not illustrated, two Al wiring layers are formed above the information storage capacitor elements C in such a manner that they sandwich an interlayer insulating film formed of a silicon oxide film, and a passivation film formed of a laminate consisting of a silicon nitride film and a silicon oxide film is formed above the Al wiring layers to manufacture the DRAM-logic hybrid LSI of this embodiment.

According to this embodiment, as the silicon oxynitride gate insulating film 6 is formed by using both an oxynitridation treatment and a nitrogen plasma treatment, the concentration of nitrogen in the film can be increased without raising the concentration of nitrogen near the interface between the substrate 1 and the gate insulating film 6 to a higher level than required.

Thereby, the gate insulating film having a high dielectric constant can be formed without reducing the carrier mobility of the p channel MISFET (Qp), thereby making it possible to reduce the leak current of MISFET. Also, the hot carrier resistance of MISFET and the electron mobility of the n channel MISFET can be improved. Further, variations in the threshold voltage of the p channel MISFET (Qp) caused by the leakage of boron can be suppressed.

Since an oxynitridation treatment which requires a heat treatment at a high temperature is carried out only once, the excessive growth of the gate insulating film 6 is suppressed, thereby making it possible to obtain a gate insulating film as thin as 5 nm or less.

Embodiment 3

The method of forming a gate insulating film according to this embodiment will be described with reference to FIGS. 27 to 29.

Figure 27:
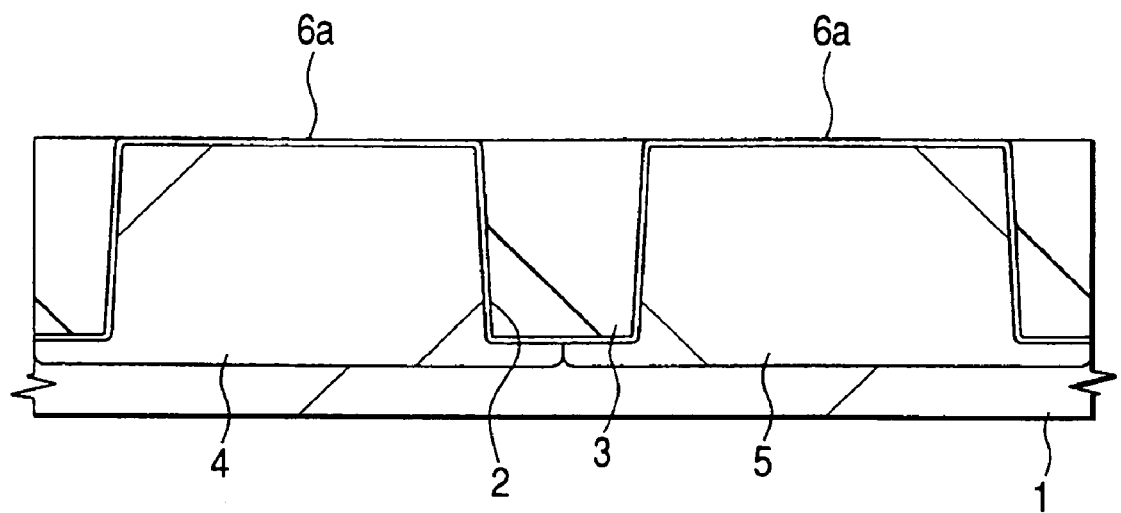
FIG. 27 is a sectional view of the principal portion of a semiconductor substrate showing a method of manufacturing a semiconductor integrated circuit device according to still another embodiment of the present invention.

As shown in FIG. 27, element separation grooves 2 , p type wells 4 and n type wells 5 are formed on the main surface of the substrate 1, and the substrate 1 is wet oxidized to form a silicon oxide film 6a having a thickness of 1 to 1.5 nm on the surfaces of the p type wells 4 and the n type wells 5 in the same manner as in the above Embodiment 1.

Figure 28:
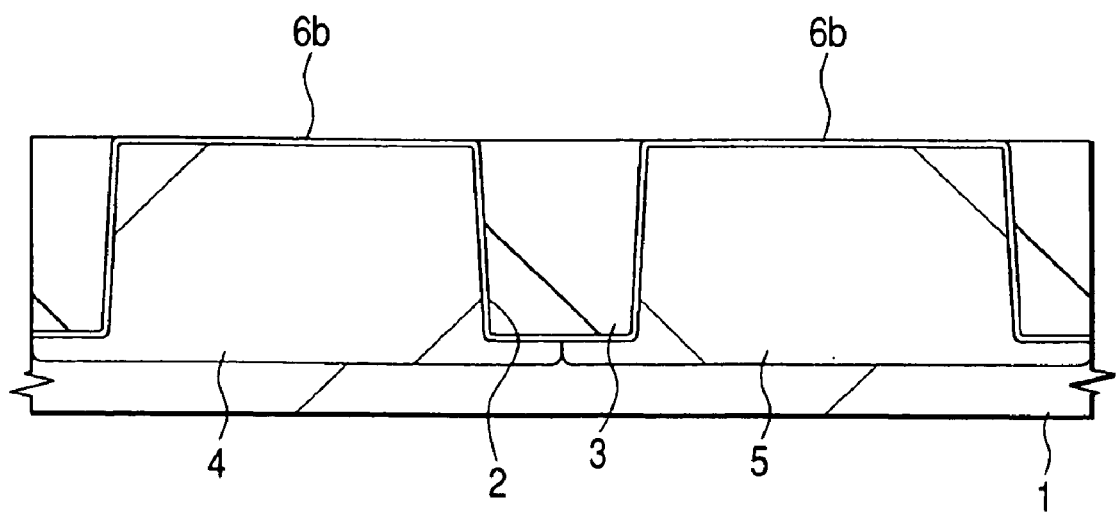
FIG. 28 is a sectional view of the principal portion of a semiconductor substrate showing the method of manufacturing a semiconductor integrated circuit device according to the still another embodiment of the present invention.

As shown in FIG. 28, the substrate 1 is heated in an atmosphere containing 5% of an NO gas at 900 to 1,100° C. Thereby, nitrogen is introduced into the silicon oxide film 6a formed on the surface of the substrate 1 and a silicon oxynitride film 6b in which nitrogen segregates near the interface with the substrate 1 is formed as in the above Embodiment 1. Conditions for carrying out the above heat treatment (oxynitridation treatment) must be set to ensure that the concentration of nitrogen near the interface between the silicon oxynitride film 6b and the substrate 1 should be 1 to 10 atomic % as in the above Embodiment 1.

Figure 29:
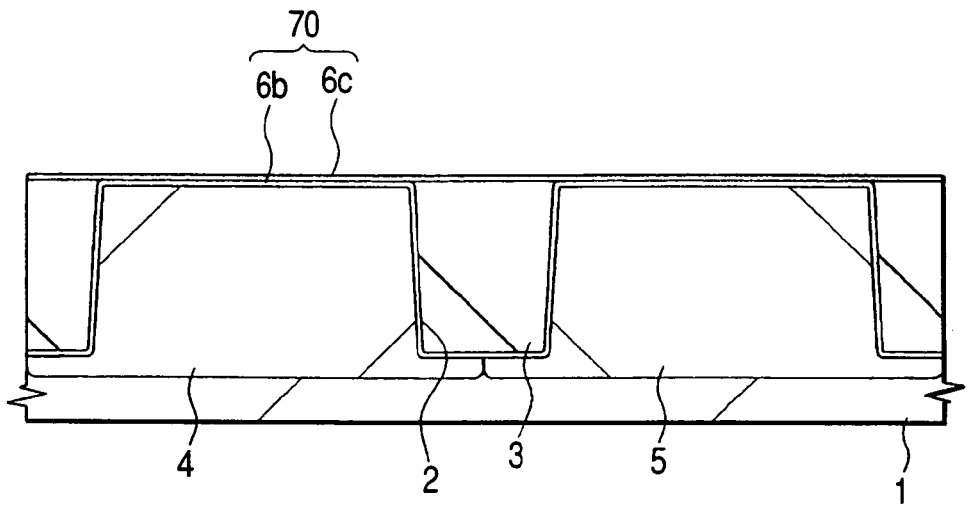
FIG. 29 is a sectional view of the principal portion of a semiconductor substrate showing the method of manufacturing a semiconductor integrated circuit device according to the still another embodiment of the present invention.
Figure 30:
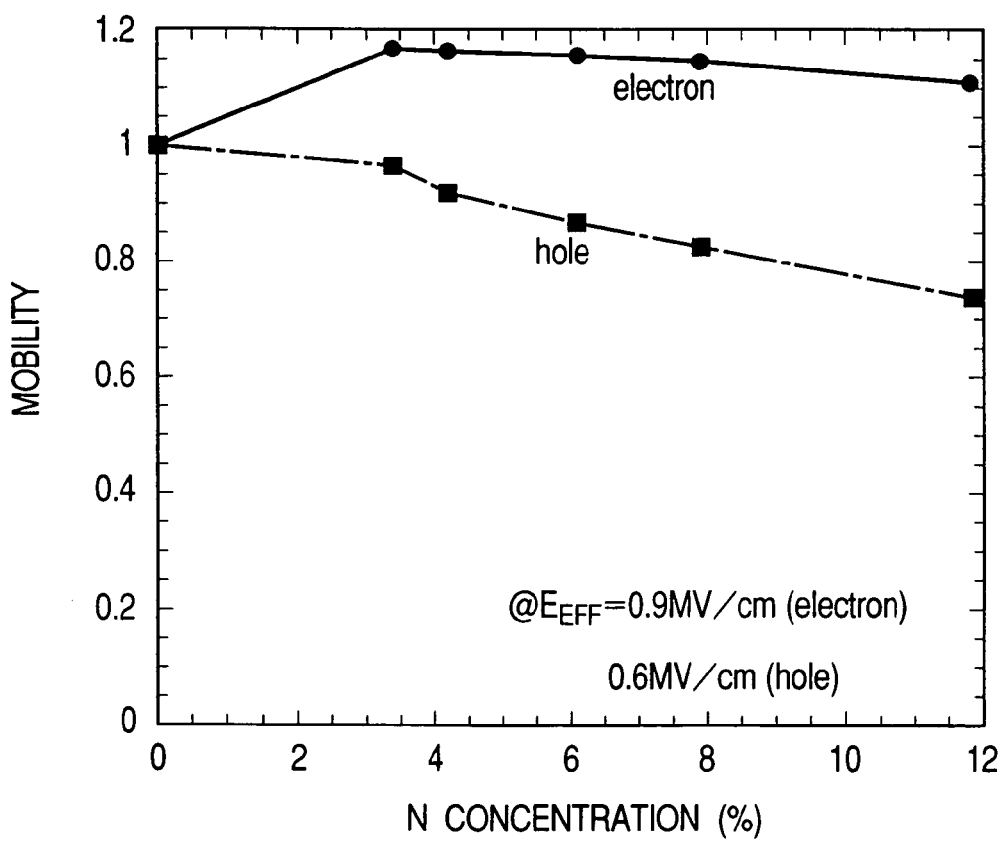
FIG. 30 is a graph showing the relationship between the concentration of nitrogen near the interface between the gate insulating film and the substrate and the carrier mobility of MISFET.

As shown in FIG. 29, a silicon nitride film 6c having a thickness of about 1 to 1.5 nm is deposited above the silicon oxynitride film 6b by CVD to obtain a gate insulating laminate film 70 consisting of the silicon oxynitride film 6b and the silicon nitride film 6c.

Since the above gate insulating film 70 formed of a laminate consisting of the silicon oxynitride film 6b and the silicon nitride film 6c has the silicon nitride film 6c on the surface side, it has a higher dielectric constant than a gate insulating film formed of only the silicon oxynitride film 6b in which nitrogen segregates near the interface with the substrate 1.

Since the gate insulating film 70 is thus formed of a laminate consisting of the silicon oxynitride film 6b and the silicon nitride film 6c, it has a high dielectric constant without raising the concentration of nitrogen near the interface with the substrate 1 to a higher level than required.

Thereby, the leak current of MISFET can be reduced without deteriorating the carrier mobility of the p channel MISFET (Qp) Also, the hot carrier resistance of MISFET and the electron mobility of the n channel MISFET can be improved. Further, variations in the threshold voltage of the p channel MISFET (Qp) caused by the leakage of boron can be suppressed.

Since an oxynitridation treatment which requires a heat treatment at a high temperature is carried out only once, the excessive growth of the gate insulating film 70 is suppressed, thereby making it possible to obtain a gate insulating film 70 as thin as 5 nm or less.

While the invention made by the inventors of the present invention has been described based on the above Embodiments, it is needless to say that the present invention is not limited to the above embodiments and that various changes and modifications may be made in the invention without departing from the spirit and scope thereof.

An effect obtained by a typical one of the inventions disclosed by the present application is briefly described below.

When a gate insulating film made from silicon oxynitride is to be formed by introducing nitrogen into a silicon oxide film, by using both an oxynitridation treatment and a nitrogen plasma treatment, a gate insulating film having a high concentration of nitrogen can be formed without increasing the concentration of nitrogen near the interface between the substrate and the gate insulating film to a higher level than required.

What is claimed is:

1. A method of manufacturing a semiconductor integrated circuit device having a p-type MISFET, comprising the steps of:
   (a) forming a silicon oxide film, for a gate insulating film of said p-type MISFET, on a main surface of a semiconductor substrate made of monocrystalline silicon, by heating the semiconductor substrate;
   (b) introducing nitrogen into the silicon oxide film by heating the semiconductor substrate in an atmosphere containing an NO gas or N₂O gas;
   (c) after step (b), introducing nitrogen into the silicon oxide film by exposing the semiconductor substrate to a nitrogen plasma atmosphere; and
   (d) forming a gate electrode of said p-type MISFET, doped with a p-type impurity, over the main surface after the steps (b) and (c); and
   (e) forming p-type semiconductor areas for source and drain regions of said p-type MISFET, in said semiconductor substrate,
   such that, in the semiconductor integrated circuit device formed, the nitrogen introduced into the silicon oxide film has a first peak concentration near the interface between the semiconductor substrate and the gate insulating film and a second peak concentration near the surface of the gate insulating film, and the second peak concentration of nitrogen is made higher than 10 atomic %.

2. A method of manufacturing a semiconductor integrated circuit device according to claim 1, wherein the first peak concentration of nitrogen is in the range of 1 to 10 atomic %.

3. A method of manufacturing a semiconductor integrated circuit device according to claim 1, wherein the gate insulating film has a thickness of 5 nm or less.

4. A method of manufacturing a semiconductor integrated circuit device according to claim 1, wherein the gate electrode contains a silicon film doped with boron.

5. A method of manufacturing a semiconductor integrated circuit device according to claim 1, wherein the introduction of nitrogen by exposing the semiconductor substrate to a nitrogen plasma atmosphere is carried out at a temperature of 600° C. or less.

6. A method of manufacturing a semiconductor integrated circuit device according to claim 5, wherein during the introduction of nitrogen by exposing the semiconductor substrate to a nitrogen plasma atmosphere, the semiconductor substrate is heated at a temperature of at least 200° C.

7. A method of manufacturing a semiconductor integrated circuit device according to claim 1, wherein during the introduction of nitrogen by exposing the semiconductor substrate to a nitrogen plasma atmosphere, the semiconductor substrate is heated at a temperature of at least 200° C.

8. A method of manufacturing a semiconductor integrated circuit device having a p-type MISFET, comprising the steps of:
   (a) forming a gate insulating film of the p-type MISFET over a semiconductor substrate, and the gate insulating film is formed of a silicon oxide film,
   (b) heating the gate insulating film in an atmosphere containing an NO gas or N₂O gas;
   (c) after step (b), introducing nitrogen radicals to the gate insulating film by a nitrogen plasma treatment;
   (d) after the steps (b) and (c), forming a gate electrode of the p-type MISFET, doped with boron, over the gate insulating film; and
   (e) after the step (d), forming p-type semiconductor areas for source and drain regions of the p-type MISFET in the semiconductor substrate,
   such that, in the semiconductor integrated circuit device formed, the gate insulating film has a first peak concentration of nitrogen near the interface between the semiconductor substrate and the gate insulating film and a second peak concentration of nitrogen near the interface between the gate insulating film and the gate electrode.

9. A method of manufacturing a semiconductor integrated circuit device according to claim 8, wherein the second peak concentration is higher than the first peak concentration.

10. A method of manufacturing a semiconductor integrated circuit device according to claim 8, wherein the second peek concentration is made higher than 10 atomic %.

11. A method of manufacturing a semiconductor integrated circuit device according to claim 8, wherein the first peak concentration of the nitrogen is in the range of 1 to 10 atomic %.

12. A method of manufacturing a semiconductor integrated circuit device according to claim 8, wherein the step (c) is carried out while the semiconductor substrate is heated at 200 to 600° C.

13. A method of manufacturing a semiconductor Integrated circuit device according to claim 8, wherein the gate insulating film has a thickness of 5 nm or less.

14. A method of manufacturing a semiconductor integrated circuit device, comprising the steps of:
   (a) forming an n-type well in a semiconductor substrate;
   (b) forming a silicon oxide film over the n-type well;
   (c) heating the silicon oxide film in an atmosphere containing an NO gas or $N_2O$ gas;
   (d) after step (c), introducing nitrogen radicals to the silicon oxide film by a nitrogen plasma treatment;
   (e) after the steps (c) and (d), forming a polycrystal silicon film doped with a p-type impurity over the silicon oxide film; and
   (f) after the step (e), forming p-type semiconductor areas in the n-type well,
   such that, in the semiconductor integrated circuit device formed, the silicon oxide film has a first peak concentration of nitrogen near the interface between the n-type well and the silicon oxide film and a second peak concentration of nitrogen near the interface between the polycrystal silicon film and the silicon oxide film.

15. A method of manufacturing a semiconductor integrated circuit device according to claim 14, wherein the second peak concentration is higher than the first peak concentration.

16. A method of manufacturing a semiconductor integrated circuit device according to claim 14, wherein the second peak concentration is made higher than 10 atomic %.

17. A method of manufacturing a semiconductor integrated circuit device according to claim 14, wherein the first peak concentration of the nitrogen is in the range of 1 to 10 atomic %.

18. A method of manufacturing a semiconductor integrated circuit device according to claim 14, wherein the step (d) is carried out while the semiconductor substrate is heated at 200 to 600° C.

19. A method of manufacturing a semiconductor integrated circuit device according to claim 14, wherein the silicon oxide film has a thickness of 5 nm or less.

* * * * *